(12) United States Patent  (10) Patent No.: US 7,791,180 B2
Shirasaka  (45) Date of Patent: Sep. 7, 2010

(54) PHYSICAL QUANTITY SENSOR AND LEAD FRAME USED FOR SAME

(75) Inventor: Kenichi Shirasaka, Hamamatsu (JP)

(73) Assignee: Yamaha Corporation, Shizuoka-Ken (JP)

( * ) Notice: Subject to any disclaimer, the term of this patent is extended or adjusted under 35 U.S.C. 154(b) by 777 days.

(21) Appl. No.: 11/571,294

(22) PCT Filed: Sep. 30, 2005

(86) PCT No.: PCT/JP2005/018168

§ 371 (c)(1),
(2), (4) Date: Dec. 26, 2006

(87) PCT Pub. No.: WO2006/038564

PCT Pub. Date: Apr. 13, 2006

(65) Prior Publication Data

US 2007/0220988 A1    Sep. 27, 2007

(30) Foreign Application Priority Data

Oct. 1, 2004    (JP)    ............. 2004-290472
Oct. 8, 2004    (JP)    ............. 2004-296370
Mar. 25, 2005   (JP)    ............. 2005-087621

(51) Int. Cl.
    *H01L 23/62*    (2006.01)
(52) U.S. Cl. .................. 257/674; 257/676
(58) Field of Classification Search .......... 257/666–676
    See application file for complete search history.

(56) References Cited

U.S. PATENT DOCUMENTS

| | | | |
|---|---|---|---|
| 5,450,283 A | 9/1995 | Lin et al. | |
| 5,866,818 A | 2/1999 | Sumi et al. | |
| 5,872,395 A | 2/1999 | Fujimoto | |
| 6,081,978 A | 7/2000 | Utsumi et al. | |
| 6,146,919 A | 11/2000 | Tandy | |
| 6,166,430 A | 12/2000 | Yamaguchi | |
| 6,596,561 B2 | 7/2003 | Takahashi et al. | |
| 6,692,991 B2 | 2/2004 | Minamio et al. | |
| 6,830,955 B2 | 12/2004 | Shin et al. | |
| 2003/0052418 A1 | 3/2003 | Yasuda | |
| 2004/0103530 A1* | 6/2004 | Adachi et al. | .......... 29/854 |

(Continued)

FOREIGN PATENT DOCUMENTS

CN    1490632    4/2004

(Continued)

*Primary Examiner*—Leonardo Andújar
(74) *Attorney, Agent, or Firm*—DicksteinShapiroLLP

(57) ABSTRACT

A lead frame made from a metallic thin plate, comprising: at least two stage portions on which a physical quantity sensor chip is mounted, and which have an area smaller than a mounting surface of the physical quantity sensor chip; a rectangular frame portion which encloses the stage portions; a plurality of leads including connecting leads which extend in a direction of the stage portion from the frame portion and are positioned on the periphery of the stage portion, and which connect the frame portion and each of the stage portions; and an easily deformed portion formed on the connecting leads which inclines the stage portion by becoming deformed; and the physical quantity sensor chip is mounted by superimposing the mounting surface on the stage portion and a portion of the plurality of leads in the direction of thickness of the frame portion.

15 Claims, 24 Drawing Sheets

U.S. PATENT DOCUMENTS

2006/0017143 A1  1/2006  Shimanuki et al.
2006/0042382 A1  3/2006  DCamp et al.

FOREIGN PATENT DOCUMENTS

| | | |
|---|---|---|
| JP | 63-121443 | 5/1988 |
| JP | 01-110752 | 4/1989 |
| JP | 01-150347 | 6/1989 |
| JP | 2-153557 | 6/1990 |
| JP | 02153557 A * | 6/1990 |
| JP | 05-218274 | 8/1993 |
| JP | 07-226475 | 8/1995 |
| JP | 09-027585 | 1/1997 |
| JP | 09-236616 | 9/1997 |
| JP | 09-292408 | 11/1997 |
| JP | 11-340409 | 12/1999 |
| JP | 2000-031366 | 1/2000 |
| JP | 2000-124239 | 4/2000 |
| JP | 2000-164949 | 6/2000 |
| JP | 2002-156204 | 5/2002 |
| JP | 2002-343817 | 11/2002 |
| JP | 2003-174131 | 6/2003 |
| JP | 2004-125778 | 4/2004 |
| JP | 2004-125779 | 4/2004 |
| JP | 2004-127874 | 4/2004 |
| JP | 2004-128472 | 4/2004 |
| JP | 2004-128473 | 4/2004 |
| WO | WO 2004/004005 | 1/2004 |

* cited by examiner

PHYSICAL QUANTITY SENSOR AND LEAD FRAME USED FOR SAME

TECHNICAL FIELD

This invention relates to a physical quantity sensor which determines the azimuth and the orientation of physical quantities, such as magnetism, gravity, and the like, and a lead frame used for the same.

Priority is claimed on Japanese Patent Application No. 2004-290472 filed Oct. 1, 2004, Japanese Patent Application No. 2004-296370 filed Oct. 8, 2004, and Japanese Patent Application No. 2005-87621 filed Mar. 25, 2005, the contents of which are incorporated herein by reference.

BACKGROUND ART

In recent years, amongst portable terminal devices, such as mobile telephones, devices possessing a GPS (Global Positioning System) function, which displays the position information of users, have emerged. In addition to this GPS function, by providing a function which accurately detects terrestrial magnetism, and a function which detects acceleration, detection of the azimuth and the orientation in three-dimensional space, or the movement direction, of the portable terminal device carried by the user can be performed. In order to provide the functions mentioned above to the portable terminal device, it becomes necessary to integrate physical quantity sensors such as magnetic sensors and acceleration sensors into the portable terminal device. In order to detect the azimuth and the acceleration in three-dimensional space with such physical quantity sensors, there is a need to install a physical quantity sensor chip on an inclined installation surface.

As a physical quantity sensor mentioned above, a variety of devices are currently being provided. For example, as one of these, a magnetic sensor differing to the above-mentioned configuration, where two magnetic sensor chips are installed on a non-inclined installation surface, is known. This magnetic sensor is mounted on a substrate, and possesses a first magnetic sensor chip (physical quantity sensor chip) which responds to the magnetic components of an external magnetic field in two directions (X and Y directions) which are mutually perpendicular along the surface of the substrate, and a second magnetic sensor chip which responds to the magnetic component of the external magnetic field in the direction (Z direction) which is perpendicular to the surface of the substrate. As a result of the magnetic components detected by the pair of magnetic sensor chips, this magnetic sensor performs measurement of the terrestrial magnetic components as a vector in three-dimensional space.

However, since the second magnetic sensor chip is mounted in a state where it is vertically standing with respect to the surface of the substrate, this magnetic sensor has an inconvenience in that the thickness (the height with respect to the Z direction) increases. Accordingly, in order to make this thickness as small as possible, as mentioned above, the physical quantity sensor chip is installed on an inclined installation surface, as disclosed in Patent Documents 1, 2, and 3.

For example, Patent Document 1 discloses an acceleration sensor as a physical quantity sensor. This acceleration sensor is a one-sided beam structure, and is installed with the acceleration sensor chip inclined with respect to the substrate beforehand. Accordingly, the sensitivity in the fixed axial direction corresponding to the inclination direction is highly retained, and the sensitivity in the other axial directions, including the directions along the surface of the substrate, can be decreased.

However, in a conventional physical quantity sensor, since the physical quantity sensor chip is positioned on an inclined installation surface, a sufficient area and height becomes necessary for packaging. Accordingly, there was a limit to compact integration within small portable terminal devices using conventional packaging.

[Patent Document 1] Japanese Unexamined Patent Application, First Publication No. Hei 9-292408.

[Patent Document 2] Japanese Unexamined Patent Application, First Publication No.2002-156204.

[Patent Document 3] Japanese Unexamined Patent Application, First Publication No. 2004-128473.

DISCLOSURE OF INVENTION

This invention takes into account the above-mentioned circumstances, with an object in providing a physical quantity sensor which can store a physical quantity sensor chip that is inclined inside a small and thin package, and a lead frame used for the same.

In order to solve the above-mentioned problems, the lead frame according to the present invention, made from a metallic thin plate, comprises: at least two stage portions on which a physical quantity sensor chip is mounted, and which have an area smaller than a mounting surface of the physical quantity sensor chip; a rectangular frame portion which encloses the stage portions; a plurality of leads including connecting leads which extend in a direction of the stage portion from the frame portion and are positioned on the periphery of the stage portion, and which connect the frame portion and each of the stage portions; and an easily deformed portion formed on the connecting leads which inclines the stage portion by becoming deformed, wherein the physical quantity sensor chip is to be mounted by superimposing the mounting surface on the stage portion and a portion of the plurality of leads in the direction of thickness of the frame portion.

In a lead frame according to the present invention, the connecting leads are the leads which are aligned with one side of the frame portion, and an easily deformed portion for inclining the stage portion with respect to the frame portion about a principal axis line, may be formed on a midway portion of the connecting leads thereof.

When two or more physical quantity sensor chips are mutually inclined using a lead frame of this configuration, a physical quantity sensor chip is firstly mounted on the surface of each stage portion. A portion of the mounting surface of the physical quantity sensor chip protrudes from the stage portion, and it is therefore positioned superimposed with a portion of the plurality of leads. Next, by pressing the stage portion in a state where the frame portion is fixed, the easily deformed portion deforms and the stage portion and the physical quantity sensor chip can be inclined about the principal axis line with respect to the frame portion.

Here, since the easily deformed portion is formed on a midway portion of the connecting leads, the end portions of the connecting leads, which are positioned closer to the stage portion than the easily deformed portion, incline together with the stage portion. That is to say, even if the end portions of these connecting leads and the physical quantity sensor chip are disposed in a location in which they overlap in the direction of thickness of the lead frame, it is possible to prevent mutual interference (contact) between the physical quantity sensor chip and the connecting leads.

Furthermore, in a lead frame according to the present invention, the connecting leads are connected to the frame portion by protruding pairwise from each stage portion in a location of line symmetry of a principal axis line which passes through the center of the stage portion, and have a deformable twisting portion as the easily deformed portion, and this twisting portion and the stage portion may be positioned in a location which is displaced with respect to the leads in the direction of thickness of the lead frame.

According to a lead frame of this configuration, by pressing the stage portion in a state where the frame portion is fixed, because the pair of connecting leads connected to each stage portion is twisted in the twisting portion about the principal axis line, the stage portion can be inclined with respect to the frame portion.

At this time, because the twisting portion and the stage portion are positioned such that they are displaced with respect to the leads in the direction of thickness of the lead frame, even if the physical quantity sensor chip is inclined together with the stage portion in a direction approaching the leads, it is possible to prevent contact between the physical quantity sensor chip and the leads. Accordingly, the size of the lead frame can be made small compared to the size of the physical quantity sensor chip, and the size of the physical quantity sensor can be made small.

In a lead frame of the present invention, a sheet-like insulator film made from an electrically insulating material can be provided on the surface of the stage portion.

When producing the physical quantity sensor using a lead frame of this configuration, the physical quantity sensor chip is mounted on the surface of each stage portion through an insulator film. Next, the physical quantity sensor chip and the leads are electrically connected by wire bonding. Thereafter, by pressing the stage portion in a state where the frame portion is fixed, the easily deformed portion deforms, and the stage portion and the physical quantity sensor chip can be inclined with respect to the frame portion about the principal axis line.

Since the physical quantity sensor chip and the stage portion are electrically insulated by the insulator film, the connecting leads connected to the physical quantity sensor chip and the stage portion are electrically insulated. Accordingly, it is possible to use connecting leads for the electrical connections of the physical quantity sensor chip resulting from the aforementioned wire bonding. That is to say, the number of leads which can be electrically connected to the physical quantity sensor chip can be increased without changing the size of the lead frame.

In a lead frame according to the present invention, each of the stage portions are positioned in a location which is nearer to one corner of the inner area of the lead frame than the other corners, and a magnetic sensor chip may be positioned such that it is only superimposed on a plurality of leads provided on one side of the lead frame.

When producing a physical quantity sensor using a lead frame of this configuration, the physical quantity sensor chip is mounted on the surface of a stage portion which is nearer to one of the corners of the lead frame. The mounting surface, which protrudes out from the surface of the stage portion of the physical quantity sensor chip, is disposed such that it overlaps with a portion among the plurality of leads provided on the same side in the direction of thickness of the lead frame.

Thereafter, the physical quantity sensor chip and the leads are electrically connected by wire bonding. Wire bonding becomes a problem for the leads, which overlap with the physical quantity sensor chip in the direction of thickness.

However, in this configuration, compared to the case where the stage portion is positioned on a central portion of one side of the inner area of the lead frame, the number of leads which overlap with the physical quantity sensor chip decreases. Accordingly, a sufficient number of leads which can be electrically connected to the physical quantity sensor chip can be secured without changing the arrangement of the leads with respect to the rectangular frame portion. Following completion of this electrical connection, the connecting leads are deformed and the stage portion and the physical quantity sensor chip are inclined with respect to the lead frame.

In a lead frame of this configuration, the lead frame is formed in an approximate square shape, and the two stage portions may be positioned such that they are nearer to two corners located on the same side of the inner area.

According to a lead frame of this configuration, by closely disposing the stage portions on the same side of the inner area, because the inner area located on the side facing the aforementioned face becomes a surplus area, a stage portion can be additionally provided on this surplus area for mounting another physical quantity sensor chip, a signal processing LSI, or the like.

Furthermore, in a configuration where the stage portion is positioned on a corner of the inner area of the lead frame, the two stage portions may be positioned on a diagonal line of the inner area.

When the stage portion, the physical quantity sensor chip, and the leads are integrally molded by a resin using a lead frame of this configuration, the resin formation space is filled with resin by sandwiching the frame portion with a metallic mold as well as disposing the stage portion, the physical quantity sensor chip, and the leads in the resin formation space within the metallic mold. At this time, the melted resin is flowed to the aforementioned resin formation space from, amongst the rectangular inner areas, one corner located on a diagonal line which intersects another diagonal line which becomes the array direction of the two stage portions, towards the other corner side. Since the stage portion and the physical quantity sensor chip are not located on the flow path of this resin, obstruction of the flow of the melted resin due to the stage portion, the physical quantity sensor chip, or the like, can be prevented.

Furthermore, a physical quantity sensor according to the present invention comprises: a stage portion mounting a physical quantity sensor chip; a plurality of leads including connecting leads positioned in the periphery of the stage portion and connected to the stage portion; an easily deformed portion formed on the connecting leads which inclines the stage portion by deforming; a physical quantity sensor chip mounted on the inclined stage portion, and positioned such that the end portions are made to overlap with a portion of the plurality of leads in the direction of thickness of the leads; and a mold resin which integrally fixes the stage portion, the plurality of leads, and the physical quantity sensor chip.

In a physical quantity sensor according to this invention, since the physical quantity sensor chip can be inclined without bringing the leads and the physical quantity sensor chip into mutual contact, miniaturization of the physical quantity sensor can be achieved.

According to the lead frame of the present invention, it is possible to make the physical quantity sensor, which stores the physical quantity sensor chip inside a package while inclined, smaller and thinner.

BEST MODE FOR CARRYING OUT THE INVENTION

First Example

FIG. 1 to FIG. 7 show a first example of the present invention. The magnetic sensor (physical quantity sensor) according to this example measures the orientation and magnitude of an external magnetic field using the two mutually inclined magnetic sensor chips. This magnetic sensor is produced using a lead frame which is formed by performing a pressing process and an etching process on a metallic plate made from a thin-plate copper material, or the like.

Figure 1:
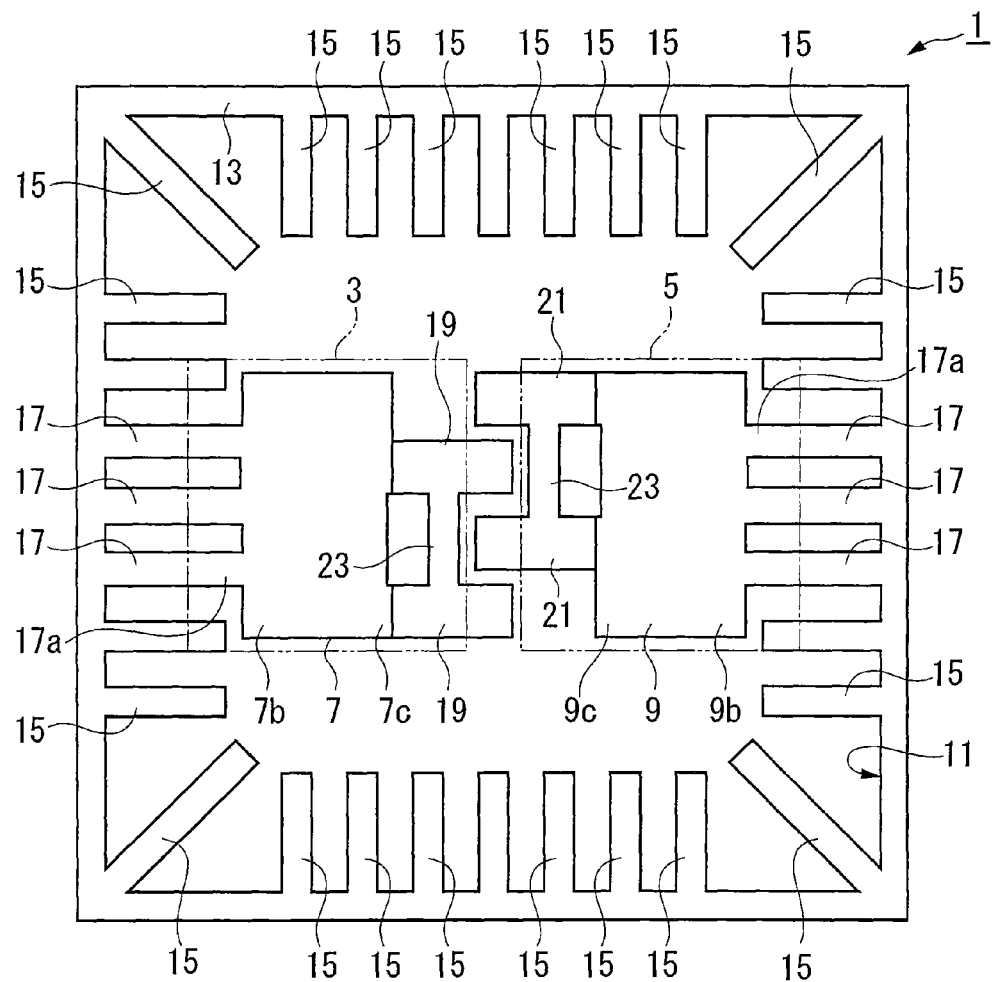
FIG. 1 is a plan view showing a lead frame according to a first example of the present invention.
Figure 2:
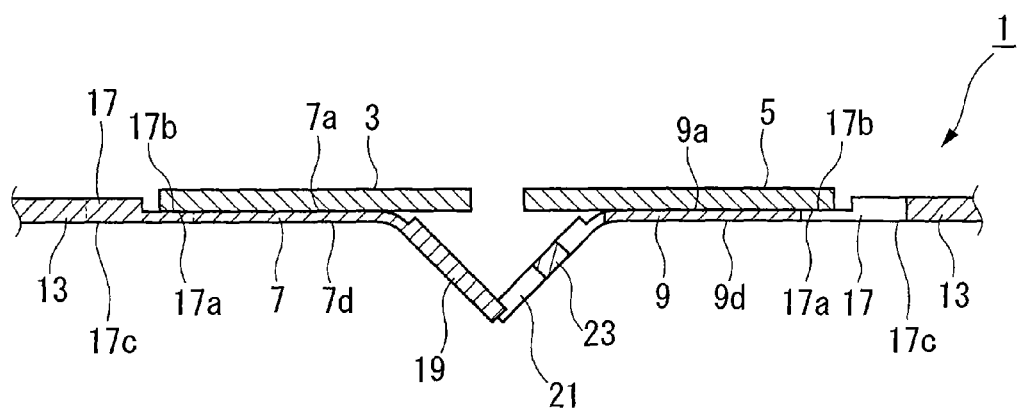
FIG. 2 is a side cross-sectional view showing a state where a magnetic sensor chip has been installed on the lead frame shown in FIG. 1.

The lead frame 1 comprises, as shown in FIGS. 1 and 2, two stage portions 7 and 9 for positioning magnetic sensor chips (physical quantity sensor chips) 3 and 5 which have been formed in a plan view rectangular shape, and a frame portion 11 which supports the stage portions 7 and 9. These stage portions 7 and 9, and the frame portion 11 are integrally formed. The frame portion 11 comprises a rectangular frame portion 13, which has been formed in a plan view rectangular frame shape so as to surround the stage portions 7 and 9, and a plurality of leads 15 and 17 which protrude from this rectangular frame portion 13 in the inward direction. The leads 15 are electrically connected to bonding pads (not shown in the drawings) of the magnetic sensor chips 3 and 5. The leads 17 (hereunder also referred to as connecting leads 17) serve a function as connecting leads which mutually connect the rectangular frame portion 13 and the stage portions 7 and 9. The leads 15 for electrical connections also include the leads which protrude from the corners of the rectangular frame portion 13.

The two stage portions 7 and 9 are positioned side by side along one side of the rectangular frame portion 13, and magnetic sensor chips 3 and 5 are respectively mounted on the surfaces 7a and 9a thereof. The one end portions 7b and 9b of the stage portions 7 and 9 are connected to a plurality of connecting leads 17 which protrude in the direction in which these two stage portions 7 and 9 are lined up.

A photoetching process is applied to the surfaces 7a and 9a of the stage portions 7 and 9, and surfaces 17b from the end portions 17a to the midway portions of the connecting leads 17 positioned on the stage portions 7 and 9 side. As a result, the thicknesses of the end portions 17a of the connecting leads 17 and the stage portions 7 and 9, is thinner than the base end portions 17c of the connecting leads 17 and protrusions 19 and 21 mentioned below. The surfaces 17b of the end portions 17a of the connecting leads 17 are coplanar with the surfaces 7a and 9a of the stage portions 7 and 9, and mount the magnetic sensor chips 3 and 5.

A pair of protrusions 19 and 21 which protrude on the back faces 7d and 9d side of the stage portions 7 and 9 are formed on each of the other end portions 7c and 9c of the mutually facing stage portions 7 and 9. These protrusions 19 and 21 are positioned such that they are alternately lined up along the width direction of the stage portions 7 and 9. The aforementioned photoetching process is also applied to the base end portions of the protrusions 19 and 21, where the protrusions 19 and 21 are bent with respect to the stage portions 7 and 9, and they are the same thickness as the stage portions 7 and 9.

That is to say, the base end portions of the protrusions 19 and 21 are formed thinner than the other portions, and are deformable. Accordingly, it becomes possible to set the inclination angle of the protrusions 19 and 21 with respect to the stage portions 7 and 9 with good accuracy.

The midway portions of these pairs of protrusions 19 and 21 are mutually connected by a rib 23.

Figure 3A:
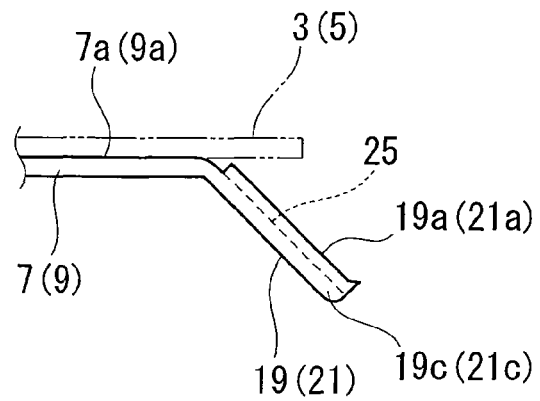
FIG. 3A is an enlarged side view showing the projections of the lead frame shown in FIG. 1.
Figure 3B:
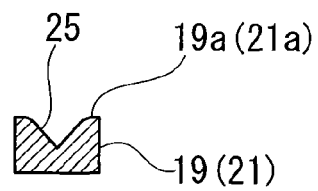
FIG. 3B is an enlarged cross-sectional view showing the projections of the lead frame shown in FIG. 1.

As shown in FIG. 3A and FIG. 3B, a V-letter shaped groove 25 is formed in the surfaces 19a and 21a of the protrusions 19 and 21 which are located on the same side as the surfaces 7a and 9a of the stage portions 7 and 9, in the longitudinal direction thereof. These ribs 23 and grooves 25 increase the rigidity of the protrusions 19 and 21, and prevent bending of the protrusions 19 and 21 when an external force is applied to the ends of the protrusions 19 and 21.

Figure 3C:
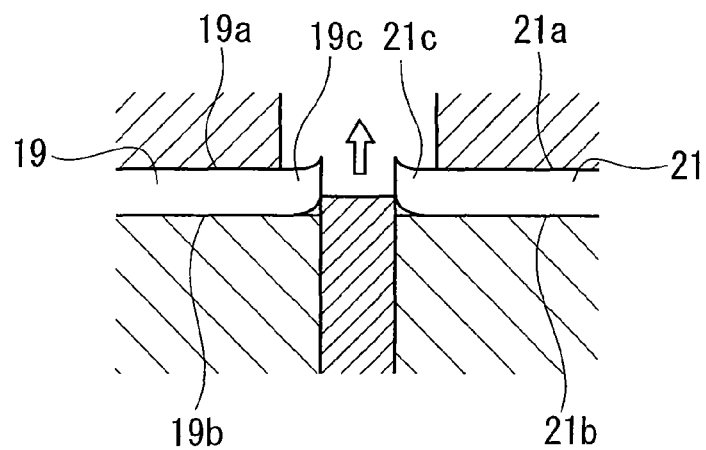
FIG. 3C is an enlarged cross-sectional view showing a formation method of the projections of the lead frame shown in FIG. 1.

These protrusions 19 and 21, as shown in FIG. 3A and FIG. 3C, are formed in a punching process for forming the lead frame 1 from a metallic thin plate, by punching from the back faces 19b and 21b thereof towards the surfaces 19a and 21a. Accordingly, the end portions 19c and 21c of the back faces 19b and 21b of the protrusions 19 and 21 assume a smooth roundness.

Next, a method of producing a magnetic sensor using the above-mentioned lead frame 1 is explained.

Firstly, as shown in FIG. 1 and FIG. 2, the magnetic sensor chips 3 and 5 are bonded to the surfaces 7a and 9a of the stage portions 7 and 9. In this state, the magnetic sensor chips 3 and 5 are positioned such that one side thereof is perpendicular to the longitudinal direction of the connecting leads 17. The magnetic sensor chips 3 and 5 are positioned in an area which spans from the end portions 17a of the connecting leads 17, which have been formed thinly as a result of the aforementioned photoetching process, to the midway portions.

Next, bonding pads (not shown in the drawings), which have been positioned equally spaced on the surfaces of the magnetic sensor chips 3 and 5, and the connecting leads 17 are electrically connected by wires (not shown in the drawings). When the stage portions 7 and 9 are inclined, since the distance from the bonding portion between the wires and the magnetic sensor chips 3 and 5 to the bonding portion between the wires and the connecting leads 17 changes, it is preferable for the material of these wires to be easily bent and soft.

Next, a resin mold portion, which integrally fixes the magnetic sensor chips 3 and 5, the stage portions 7 and 8, and the leads 15 and 17 is formed.

Figure 4:
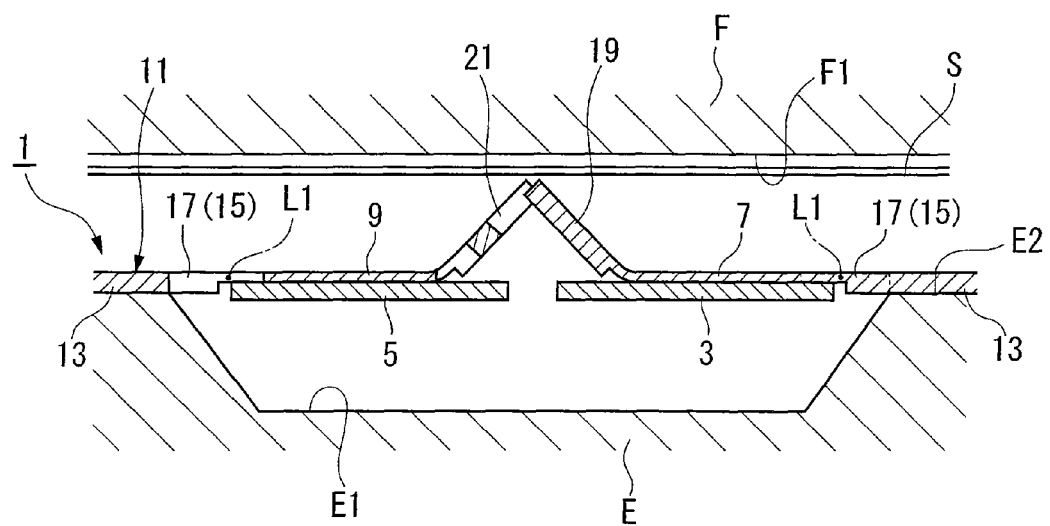
FIG. 4 is a side cross-sectional view showing a method of inclining the stage portion in the lead frame shown in FIG. 1.

That is to say, as shown in FIG. 4, the rectangular frame portion 13 of the lead frame 1 is positioned on a surface E2 of a metallic mold E, which has a concave portion E1. At this time, the leads 15 and 17, the stage portions 7 and 9, the magnetic sensor chips 3 and 5, and the protrusions 19 and 21, which are on the inside of the rectangular frame portion 13, are positioned on the upper side of the concave portion E1. In this state, the magnetic sensor chips 3 and 5, the stage portions 7 and 9, and the protrusions 19 and 21 are located in sequence from the side of the concave portion E1 towards the upper side.

On the upper side of the protrusions 19 and 21, a metallic mold F, which has a flat surface F1, is provided, which sandwiches the rectangular frame portion 13 of the lead frame 1 together with the aforementioned metallic mold E. A sheet S is inserted between this lead frame 1 and the metallic mold F to prevent resin flash, which adheres to the leads 15, and to make the metallic mold F and the resin become more easily detached.

Figure 5:
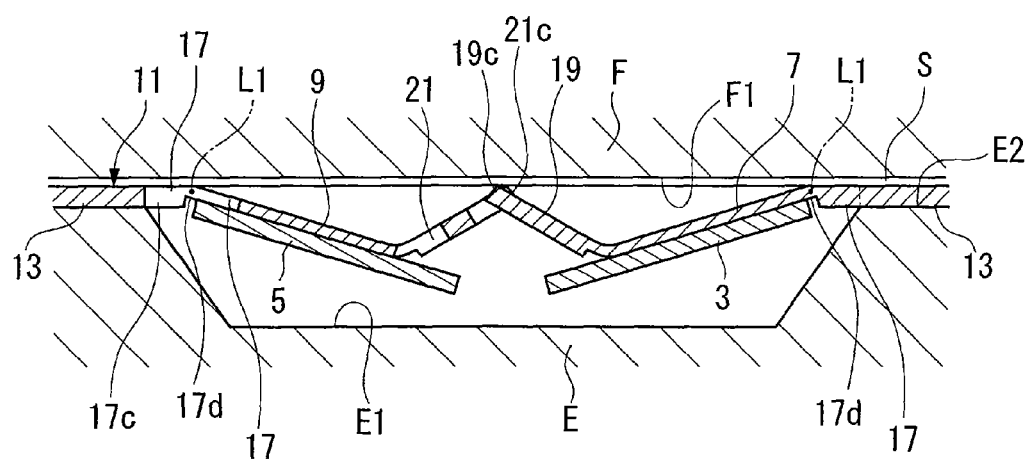
FIG. 5 is a side cross-sectional view showing a method of inclining the stage portion in the lead frame shown in FIG. 1.

Next, as shown in FIG. 5, the rectangular frame portion 13 is sandwiched by these two metallic molds E and F. Consequently, the end portions 19c and 21c of the protrusions 19 and 21 are pressed by the flat surface F of the metallic mold F. Since the rigidity of the protrusions 19 and 21 has been reinforced by the ribs 23 and the V-letter shaped grooves 25, bending of the protrusions 19 and 21 as a result of this pressing can be prevented. At this time, the end portions of the protrusions 19 and 21 and the sheet S mutually come into contact. However, since the end portions 19c and 21c of the protrusions 19 and 21, which are in contact, are in a shape assuming roundness, tearing of the sheet S by the protrusions 19 and 21 can be prevented.

When the protrusions 19 and 21 are pressed, the midway portions 17d of the connecting leads 17 connected to the stage portions 7 and 9 are deformed. Accordingly, the stage portions 7 and 9 are inclined with respect to the frame portion 1 about the principal axis line L1 which mutually connects the midway portions 17d of the connecting leads 17 which support the same magnetic sensor chip 3 and 5. The midway portions 17d of the connecting leads 17 are formed thinly by the photoetching process, and since it is an easily deformed portion, the stage portions 7 and 9 can be easily inclined. As a result, the magnetic sensor chips 3 and 5, which are installed on the stage portions 7 and 9, incline at a fixed angle with respect to the rectangular frame portion 13 and the flat surface F1.

Figure 6:
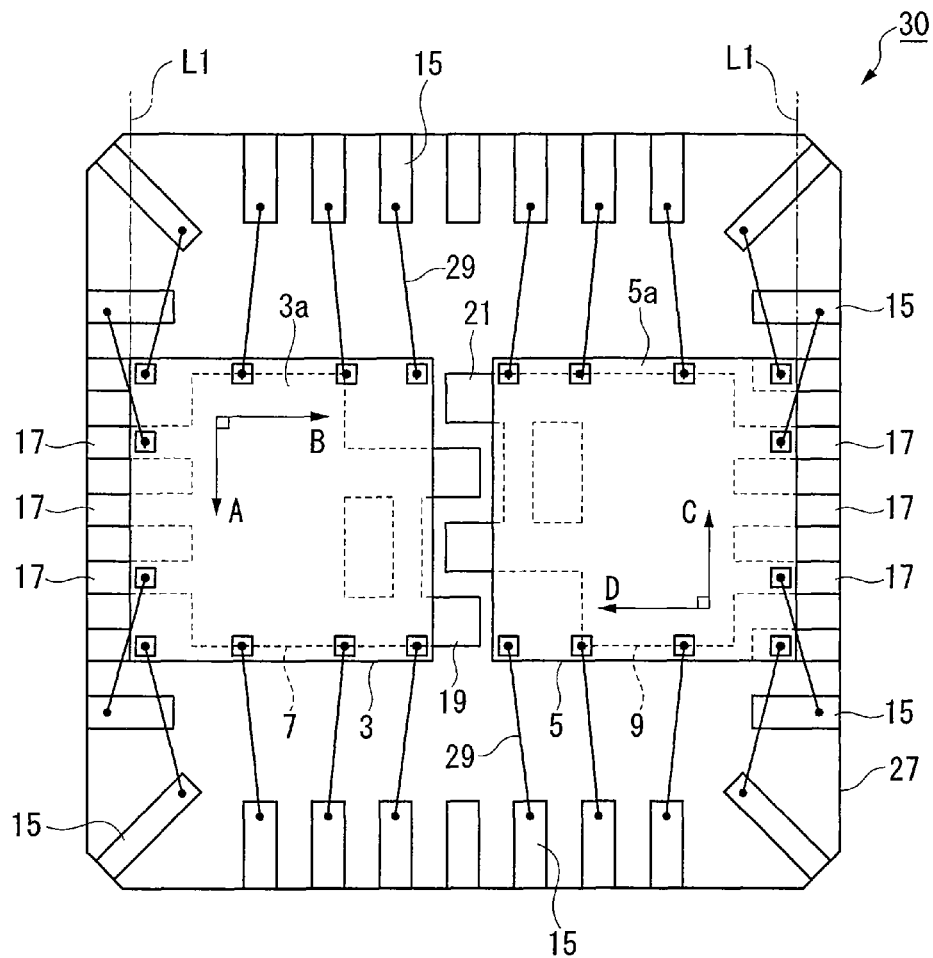
FIG. 6 is a plan view showing a magnetic sensor produced using the lead frame shown in FIG. 1.
Figure 7:
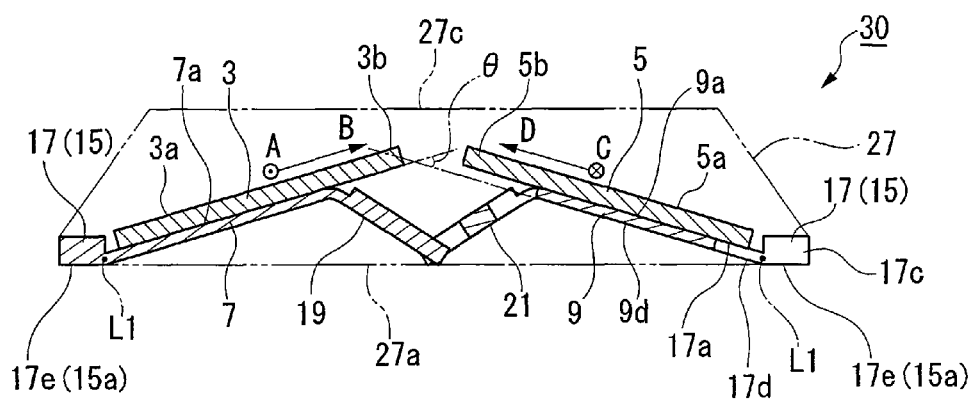
FIG. 7 is a side cross-sectional view of the magnetic sensor shown in FIG. 6.

Thereafter, in a state where the end portions 19c and 21c of the protrusions 19 and 21 are pressed by the flat surface F1 of the metallic mold F, a melted resin is injected into the metallic molds E and F, and the magnetic sensor chips 3 and 5 are embedded in the interior of the resin. As a result, as shown in FIG. 6 and 7, the magnetic sensor chips 3 and 5 are fixed in the interior of the resin mold portion 27 in a state where they are mutually inclined.

It is preferable for the resin used here to be a material with a high liquidity, so that the inclination angle of the magnetic sensor chips 3 and 5 and the stage portions 7 and 9 does not change due to flowing of the resin.

Lastly, the leads 15 and 17 are individually divided by clipping off the rectangular frame portion 13, and the production of the magnetic sensor 30 is completed.

The magnetic sensor chips 3 and 5 provided in the magnetic sensor 30 produced in the above manner are inclined with respect to the bottom surface 27a of the resin mold portion 27. Furthermore, the mutually facing one end portions 3b and 5b of the magnetic sensor chips 3 and 5 face the top surface 27c side of the resin mold portion 27. The surface 3a of the magnetic sensor chip 3 is inclined at an acute angle with respect to the surface 5a of the magnetic sensor chip 5. That is to say, an angle θ of the stage portion 7 with respect to the stage portion 9 is an acute angle.

The magnetic sensor chip 3 is respectively sensitive towards magnetic components of an external magnetic field in two directions. These two sensitive directions represent the A direction and the B direction which are mutually perpendicular along the surface 3a of the magnetic sensor chip 3.

Furthermore, the magnetic sensor chip 5 is sensitive towards magnetic components of an external magnetic field in two directions. These two sensitive directions represent the C direction and the D direction which are mutually perpendicular along the surface 5a of the magnetic sensor chip 5. Here, the A and the C directions are parallel to the principal axis line L1, and are mutually opposite directions. The B and the D directions represent directions which are perpendicular to the principal axis line L1, and are mutually opposite directions.

The A-B plane, which includes the A and the B directions along the surface 3a, intersects the C-D plane, which includes the C and the D directions along the surface 5a, at the angle θ, which is an acute angle. This angle θ is larger than 0° and is 90° or less, and theoretically, as long as it is an angle larger than 0°, the azimuth of the three-dimensional terrestrial magnetism can be measured. However, practically, it is preferable for the angle θ to be 20° or more, and it is still more preferable for it to be 30° or more.

The back faces 15a of the plurality of leads 15 for electrically connecting the magnetic sensor chips 3 and 5 to the outside, are exposed from the bottom surface 27a of the resin mold portion 27. One end portion of these leads 15 is electrically connected to the magnetic sensor chips 3 and 5 by metallic wires 29, and the connection section thereof is embedded in the interior of the resin mold portion 27.

Since the midway portions 17d and the end portions 17a of the connecting leads 17 used for inclining the stage portions 7 and 9 are inclined together with the stage portions 7 and 9, they are embedded within the resin mold portion 27. Only the back face 17e of the base end portion 17c of the connecting leads 17 is exposed from the bottom surface 27a of the resin mold portion 27.

This magnetic sensor 30 is, for example, installed on a substrate within a portable terminal device. This portable terminal device measures the azimuth of the terrestrial magnetism using the magnetic sensor 30, and displays the azimuth thereof on a display panel.

In the above-mentioned lead frame 1 and magnetic sensor 30, the easily deformed portion for inclining the stage portions 7 and 9 is formed on the midway portions 17d of the connecting leads 17. As a result, the end portions 17a of the connecting leads 17 located further on the stage portions 7 and 9 side than this easily deformed portion, incline together with the stage portions 7 and 9. Accordingly, when these end portions 17a have the magnetic sensor chips 3 and 5 positioned thereon and are inclined, the magnetic sensor chips 3 and 5 and the connecting leads 17 do not mutually interfere (contact). That is to say, the end portions 17a and the magnetic sensor chips 3 and 5 can be positioned in a location such that they overlap in the direction of thickness of the metallic thin plate. Accordingly, the magnetic sensor 30 can be made correspondingly smaller. In this manner, the magnetic sensor chips 3 and 5 can be inclined and stored in a small and thin package provided in the interior of the resin mold portion 27, and miniaturization of the magnetic sensor 30 can be easily achieved.

Furthermore, since the magnetic sensor chips 3 and 5 can be mounted on the surfaces 7a and 9a of each stage portion 7 and 9, and on the surfaces 17b of the end portions 17a of the connecting leads 17, the magnetic sensor chips 3 and 5 can be stably mounted on the surfaces 7a and 9a of the stage portions 7 and 9.

Moreover, together with forming the stage portions 7 and 9 thinner than the protrusions 19 and 21 by the photoetching process, by reinforcing the rigidity of the protrusions 19 and 21 by the rib 23 and the V-letter shaped groove 25, bending of the protrusions 19 and 21, based on the pressing force which inclines the stage portions 7 and 9 and the magnetic sensor chips 3 and 5, can be prevented. Accordingly, displacement of the inclination angle of the stage portions 7 and 9 based on this bending can be prevented.

Furthermore, since the surfaces 7a and 9a of the stage portions 7 and 9, which bond the magnetic sensor chips 3 and 5, are formed with a depression as a result of the aforementioned photoetching process, the positioning of the magnetic sensor chips 3 and 5 can be made low, and thinning of the magnetic sensor 30 can be achieved.

Moreover, since the end shape of the protrusions 19 and 21, which come into contact with the sheet S, is formed to a shape which assumes roundness, tearing of the sheet S by the protrusions 19 and 21 can be prevented, and discharging of the resin to the metallic mold F can be prevented. Accordingly, a magnetic sensor 30 which has a precise external shape can be produced.

In the above-mentioned example, although the magnetic sensor chips 3 and 5 were only made to be mounted on the surfaces 17b of the end portions 17a of the connecting leads 17, it is in no way restricted to this, and they may also be bonded.

Figure 8:
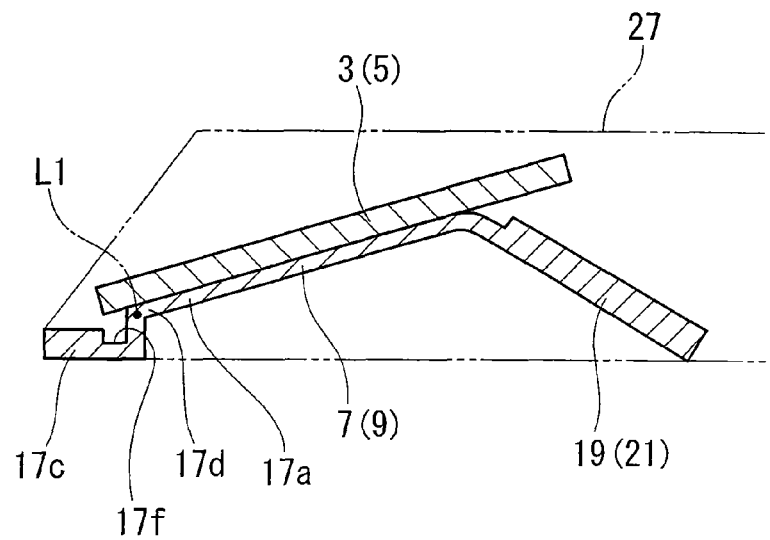
FIG. 8 is a side cross-sectional view showing an alternative example of the connecting leads according to the first example of the present invention.

Furthermore, as shown in FIG. 8, the stage portions 7 and 9 and the end portions 17a of the connecting leads 17 can be positioned in a location which is displaced with respect to the base end portion 17c of the connecting leads 17 in the direction of thickness of the metallic thin plate. In this configuration, the location of the principal axis line L1, in the same manner as the stage portions 7 and 9, is also positioned in a location which is displaced in the direction of thickness of the metallic thin plate.

In the case of this configuration, even if the magnetic sensor chips 3 and 5 go beyond the end portions 17a of the connecting leads 17, and are further positioned in a location which overlaps the base end portions 17c of the connecting leads 17 in the direction of thickness, interference (contact) on the base end portions 17c of the connecting leads 17 by the magnetic sensor chips 3 and 5, when the magnetic sensor chips 3 and 5 are inclined, can be prevented.

In addition to this configuration, concave portions 17f are formed by etching the surfaces of the base end portions 17c of the connecting leads 17 facing the magnetic sensor chips 3 and 5 by a photoetching process, or the like. As a result of this configuration, contact of the magnetic sensor chips 3 and 5 with the base end portion 17c of the connecting leads can be prevented with more certainty.

Figure 9:
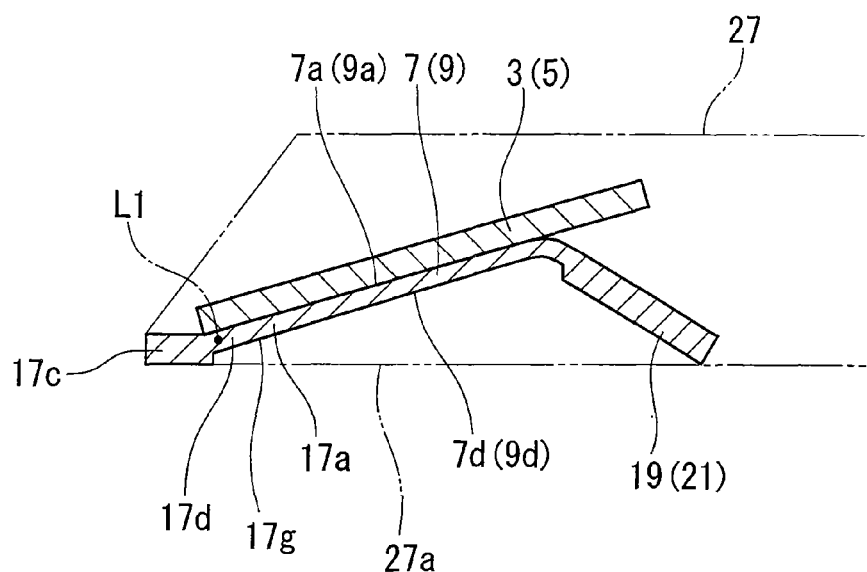
FIG. 9 is a side cross-sectional view showing an alternative example of the connecting leads according to the first example of the present invention

Furthermore, although the stage portions 7 and 9 were formed with a thin thickness by applying a photoetching process to the surface 7a and 9a sides thereof, it is in no way restricted to this. As shown in FIG. 9, a photoetching process may also be applied to the back face 7d and 9d side of the stage portions 7 and 9. In this configuration, it is preferable to also apply the same photoetching process to the back face 17g from the end portion 17a to the midway portion 17d of the connecting lead 17, and the back faces of the base end portions of the protrusions 19 and 21.

In the case of this configuration, since the filled area of the resin on the midway portions 17d of the connecting leads 17 increases in the thickness direction, the resin can be filled with certainty in this section. Furthermore, since the easily deformed portion of the midway portion 17d is embedded in the interior of the resin mold portion, the flash of the connecting leads 17 is no longer exposed from the bottom surface 27a of the resin mold portion 27.

Figure 10:
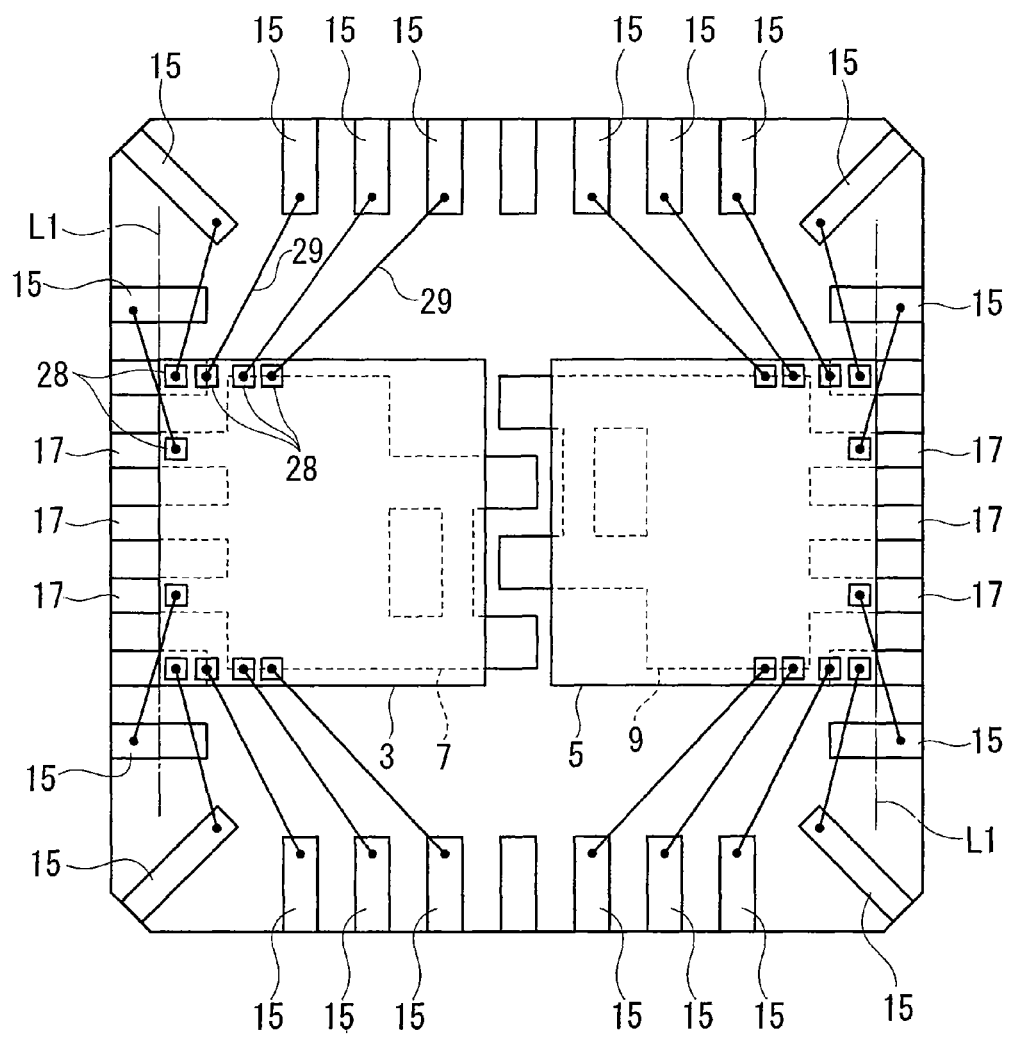
FIG. 10 is a plan view showing another example of a magnetic sensor produced using the lead frame shown in FIG. 1.

Furthermore, although an example where the bonding pads were positioned equally spaced on the surfaces of the magnetic sensor chips 3 and 5 was shown, it is in no way restricted to this. As shown in FIG. 10, the bonding pads 28 may be made to be positioned near to the principal axis line L1 on the magnetic sensor chips 3 and 5. Near to the principal axis line L1, the change in height of the bonding pads 28, which accompanies the incline of the magnetic sensor chips 3 and 5, is small. That is to say, in this configuration, the change in relative position between the leads 15 and the bonding pads 28, which occurs when the stage portions 7 and 9 are inclined following electrical connection of the leads 15 and the bonding pads 28 by wires 29, can be made small. Accordingly, separation of the wires 29 from the leads 15 and bonding pads 28, and disconnection of the wires 29, or the like, can be prevented by controlling the change in tensile strength which occurs when the stage portions 7 and 9 are inclined.

Second Example

Next, a second example according to the present invention is explained with reference to FIG. 11 to 13. The lead frame and the magnetic sensor according to this second example differ to the first example with respect to the connection between the frame portion and the stage portion. Here, only the connection section between the frame portion and the stage portion is explained, and the same reference symbols refer to parts the same as the constituent elements of the lead frame 1 and the magnetic sensor 30, and explanation thereof is omitted.

Figure 11:
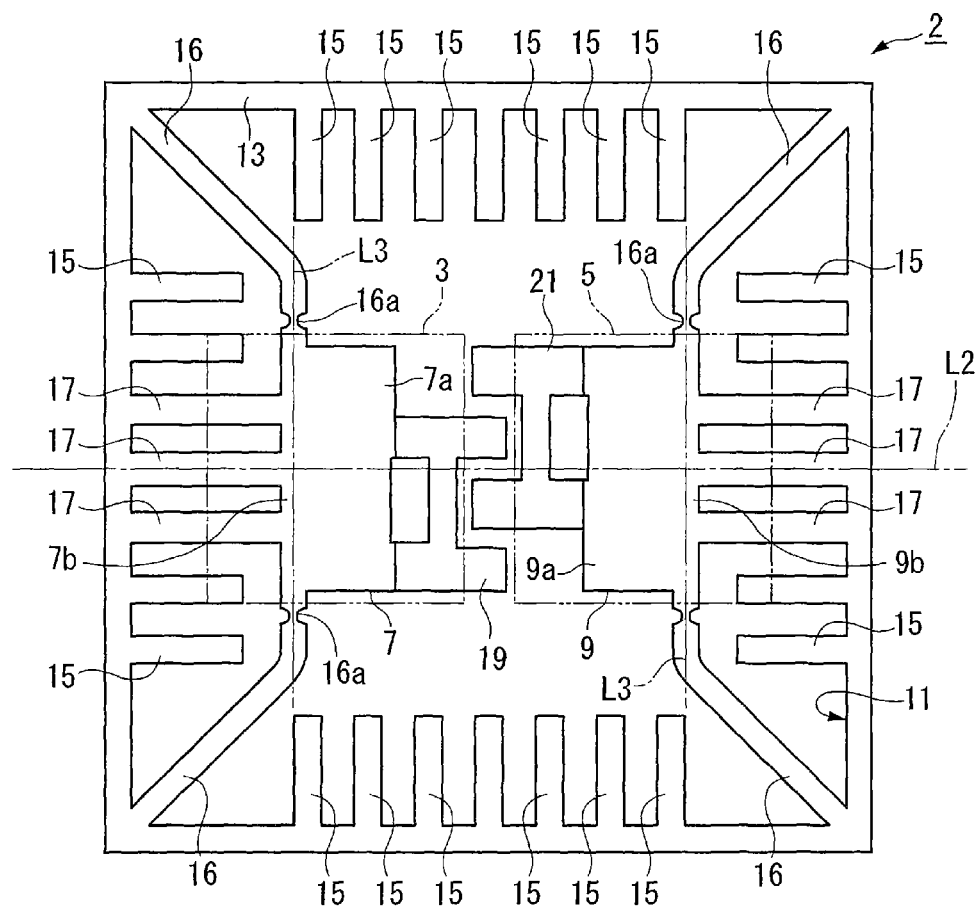
FIG. 11 is a plan view showing a lead frame according to a second example of the present invention.
Figure 12:
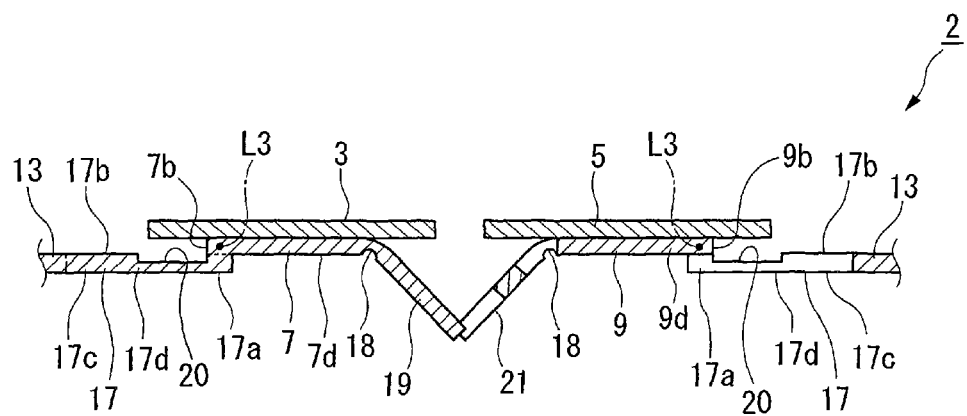
FIG. 12 is a side cross-sectional view showing a state where a magnetic sensor chip has been installed on the lead frame shown in FIG. 11.
Figure 13:
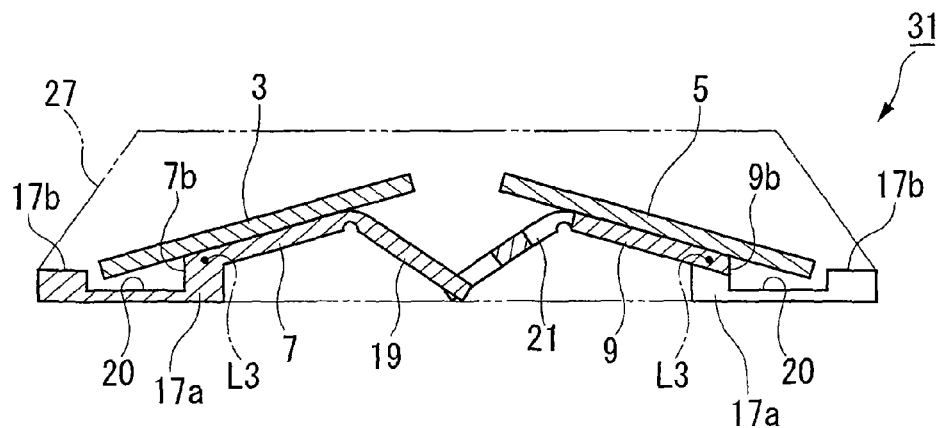
FIG. 13 is a side cross-sectional view showing a magnetic sensor produced using the lead frame shown in FIG. 11.

As shown in FIGS. 11 and 12, in this lead frame 2, the stage portions 7 and 9 and the rectangular frame portion 13 are mutually connected as a result of connecting leads (connection portions) 16 which protrude out from the corners of the rectangular frame portion 13. These connecting leads 16 are formed such that they protrude pairwise from the respective stage portions 7 and 9, in locations which become line symmetrical to the principal axis line L2 which passes through the stage portions 7 and 9. Specifically, the one end portions 16a of the connecting leads 16 are connected to end portions located on both ends on the one end portions 7b and 9b side of the stage portions 7 and 9, which are located on the connecting lead 17 side.

These one end portions 16a have a crevice shaped notch provided on the side face thereof, and are formed more thinly than the other sections of the connection leads 16. Accordingly, the one end portions 16a are twisting portions which can be easily twisted about the principal axis line L3 which connects a pair of end portions 16a, when the stage portions 7 and 9 are inclined.

The stage portions 7 and 9 and the one end portions 16a of the connection leads 16, are positioned in a location which is displaced in the direction of thickness of the metallic thin plate with respect to the entirety of the connecting leads 17. The end portions 17a of the connecting leads 17 and the one end portions 7b and 9b of the stage portions 7 and 9 are positioned such that they overlap in the thickness direction. The magnetic sensor chips 3 and 5 are positioned such that they protrude out from the surfaces 7a and 9a of these stage portions 7 and 9 to the connecting leads 17 side and the protrusions 19 and 21 side. However, in a state before the stage portions 7 and 9. are inclined with respect to the frame portion, they do not come into contact with the connecting leads 17.

Concave grooves 18 are formed on the base end portions of the protrusions 19 and 21 located on the back face 7d and 9d side of the stage portions 7 and 9, by a photoetching process. The thickness dimension of the base end portion of the protrusions 19 and 21 is formed thinner than the other sections as a result of these grooves 18, to facilitate deformation. As a result, it becomes possible to set the inclination angle of the protrusions 19 and 21 with respect to the stage portions 7 and 9 with accuracy.

Within the surfaces 17b of the connecting leads 17 which face the magnetic sensor chips 3 and 5, a concave portion 20, which is recessed in the direction of thickness of the metallic thin plate, is formed between the end portions 17a and the midway portion 17d, by the photoetching process.

When a magnetic sensor is produced using this lead frame 2, the stage portions 7 and 9, and the magnetic sensor chips 3 and 5 are inclined with respect to the frame portion by pressing the protrusions 19 and 21 with the same metallic molds as in the first example. At this time, the one end portions 16a of the connection leads 16 are twisted about the principal axis line L3. Furthermore, at this time, as shown in FIG. 13, the physical quantity sensor chips 3 and 5, which face the surfaces 17*b* of the connecting leads 17, enter into the concave portion 20.

According to the above-mentioned lead frame 2 and magnetic sensor (physical quantity sensor) 31, in a state before the stage portions 7 and 9 are inclined, a space is formed between the magnetic sensor chips 3 and 5, which are positioned protruding out from the stage portions 7 and 9, and the surfaces 17*b* of the connecting leads 17. Consequently, even if the magnetic sensor chips 3 and 5 and the connecting leads 17 overlap in the direction of thickness, when the stage portions 7 and 9 and the magnetic sensor chips 3 and 5 are inclined, interference (contact) of the magnetic sensor chips 3 and 5 with the connecting leads 17 can be prevented, and miniaturization of the magnetic sensor 31 can be achieved.

Furthermore, a portion of the inclined magnetic sensor chips 3 and 5, can be made to enter into the concave portions 20 formed in the surfaces 17*b* of the connecting leads 17 Accordingly, interference between the magnetic sensor chips 3 and 5 and the connecting leads 17 is prevented, and the magnetic sensor chips 3 and 5 can be made to incline greatly with respect to the frame portion 11, without making the length of displacement in the direction of thickness of the metallic thin plate of the stage portions 7 and 9 with respect to the connecting leads 17 excessive. Accordingly, thinning of the magnetic sensor 31 can be achieved.

In the above-mentioned example, although a concave portion 20 was formed in the connecting leads 17 in a section from the end portion 17*a* to the midway portion 17*d*, it is in no way restricted to this. For example, a concave portion may be formed over the entire surface 17*b* of the connecting leads 17, or in other words, the thickness dimension of the connecting leads 17 may be made thinner than the other sections.

Figure 14:
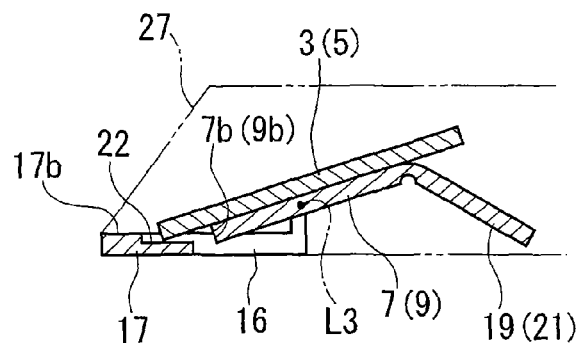
FIG. 14 is a side cross-sectional view showing a magnetic sensor using a lead frame according to an alternative example of the second example of the present invention.

Furthermore, although the stage portions 7 and 9 are connected to the connection leads 16 and the connecting leads 17, it is in no way restricted to this. As shown in FIG. 14, it is acceptable, if at the very least, the stage portions 7 and 9 are connected to connection leads with twisting portions. That is to say, it is acceptable for the stage portions 7 and 9 to not be connected to the connecting leads 17 which overlap with the magnetic sensor chips 3 and 5 in the direction of thickness. However, even in this case, it is preferable to form a concave portion 22 in the connecting leads 17, which is recessed from the surface 17*b* thereof, in order to prevent interference with the magnetic sensor chips 3 and 5.

Furthermore, although the twisting portions of the connection leads 16 are connected to the one end portions 7*b* and 9*b* of the stage portions 7 and 9, it is in no way restricted to this. The twisting portions of the connection leads 16 may also be provided in a location displaced more on the protrusions 19 and 21 side than the one end portion 7*b* and 9*b*. That is to say, the principal axis line L3 about which the stage portions 7 and 9 rotate may be displaced from the one end portions 7*b* and 9*b* side of the stage portions 7 and 9 to the protrusions 19 and 21 side.

Furthermore, although concave grooves 18 are formed in the base end portions of the protrusions 19 and 21, it is in no way restricted to this. It is acceptable, if at the very least, the protrusions 19 and 21 can be easily bent with respect to the stage portions 7 and 9. That is to say, a notch may be formed instead of the groove 18 in the base end portions of the protrusions 19 and 21.

In the above-mentioned first and second examples, the end portions 19*c* and 21*c* of the protrusions 19 and 21 which adhere to the sheet S were formed by a punching process. It is acceptable as long as these end portions 19*c* and 21*c* of the protrusions 19 and 21 are a shape which assumes roundness.

Figure 15:
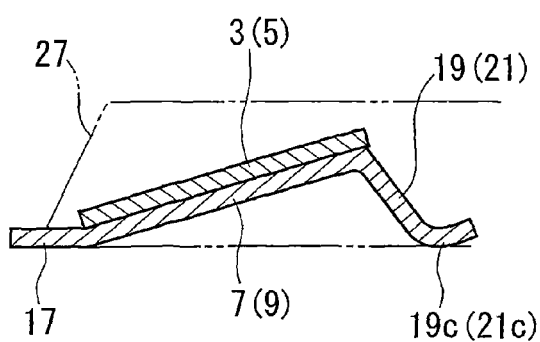
FIG. 15 is a side cross-sectional view showing an alternative example of the protrusions according to the first and the second examples of the present invention.
Figure 16:
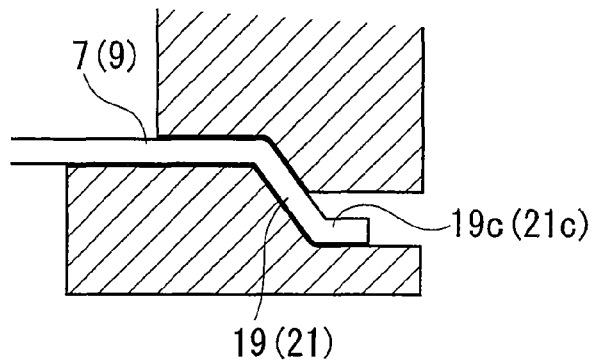
FIG. 16 is a side cross-sectional view showing a bending process of the protrusions shown in FIG. 15.

That is to say, as shown in FIG. 15, a bending process may be applied to the end portions such that the back face side of the end portions of the protrusions 19 and 21 becomes a shape assuming a convex roundness. It is preferable for this bending process, as shown in FIG. 16, to be performed at the same time as when the protrusions 19 and 21 are bent with respect to the stage portions 7 and 9 using the metallic mold.

Figure 17:
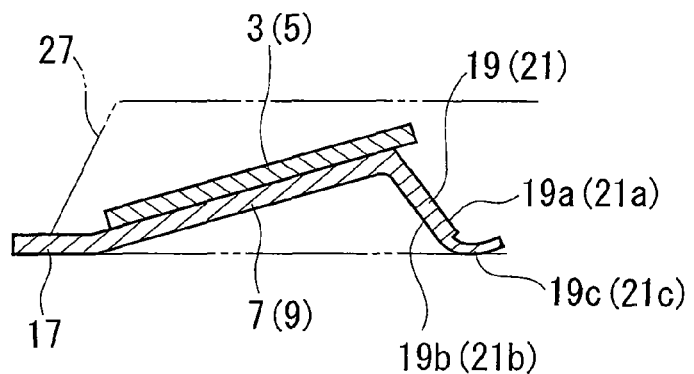
FIG. 17 is a side cross-sectional view showing another alternative example of the protrusions according to the first and the second examples of the present invention.
Figure 18:
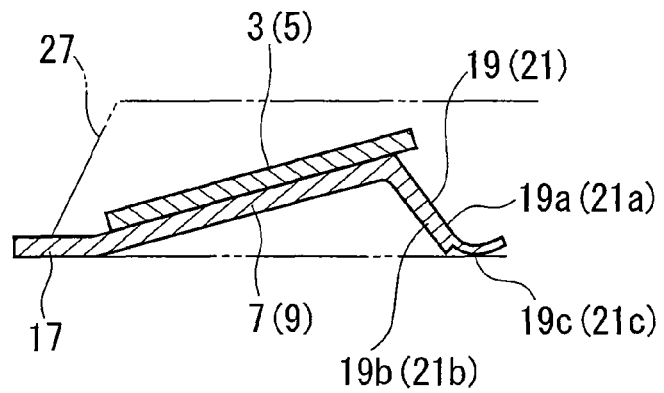
FIG. 18 is a side cross-sectional view showing another alternative example of the protrusions according to the first and the second examples of the present invention.

Furthermore, in a case where the above-mentioned bending process is applied, as shown in FIGS. 17 and 18, the thickness dimension of the end portions 19*c* and 21*c* may be formed thinner than the other sections by applying a photoetching process on the surfaces 19*a* and 21*a*, and the back faces 19*b* and 21 of the end portions 19*c* and 21*c* of the protrusions 19 and 21. In the case of this configuration, the end portions 19*c* and 21*c* can be easily bent.

Furthermore, although the protrusions 19 and 21 are formed on the other end portions 7*c* and 9*c* of the stage portions 7 and 9, which are mutually facing, it is in no way restricted to this. It is acceptable as long as the protrusions 19 and 21 at least protrude out to the back face 7*d* and 9*d* side of the stage portions 7 and 9.

Figure 19:
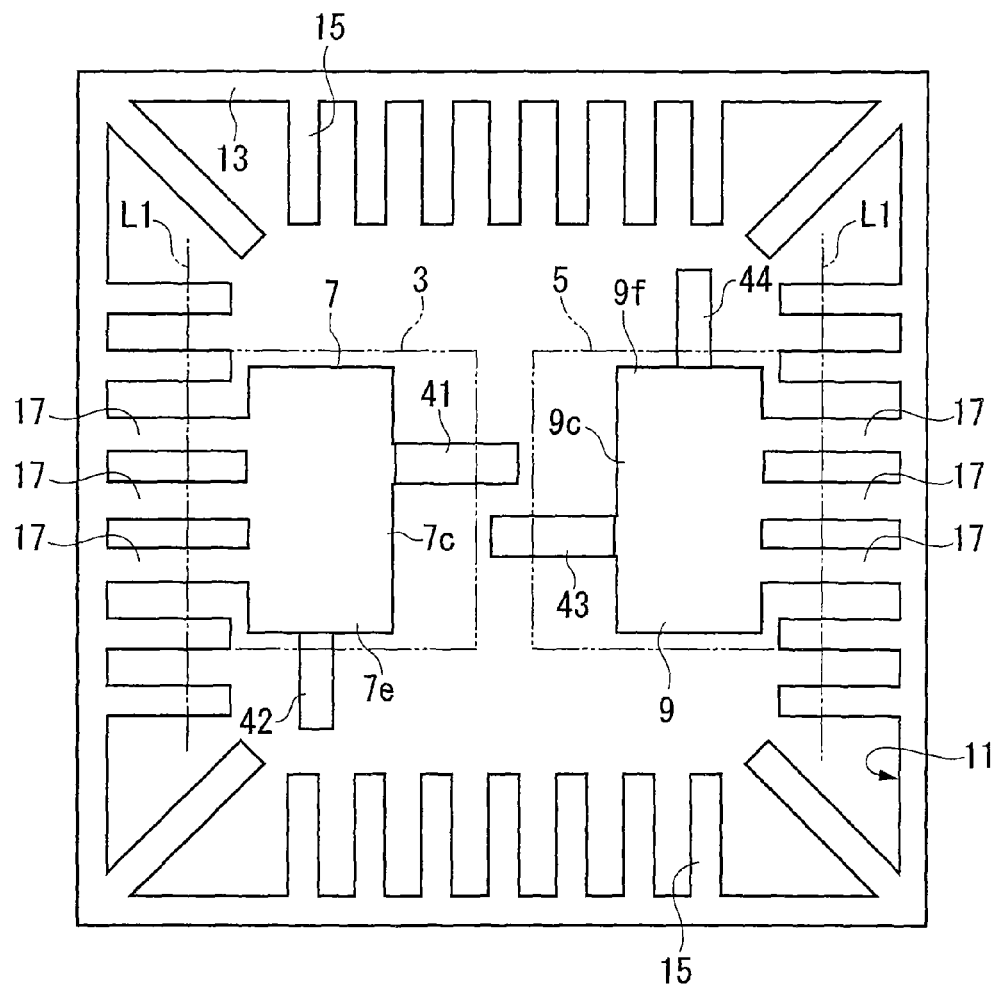
FIG. 19 is a plan view showing a first alternative example according to the first example of the present invention.
Figure 20:
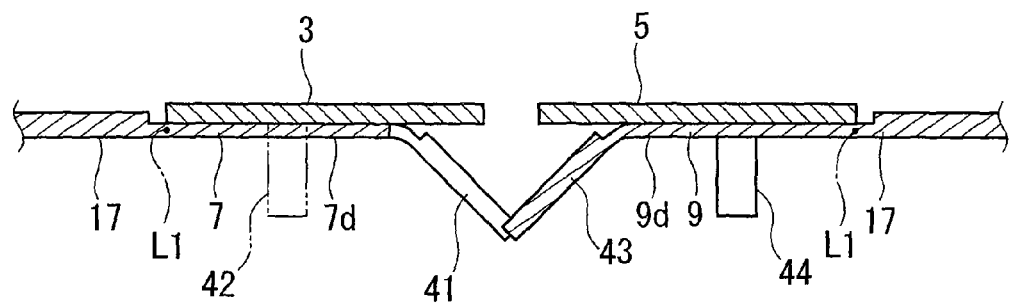
FIG. 20 is a side cross-sectional view showing a state where a magnetic sensor chip has been installed on the lead frame shown in FIG. 19.

That is to say, as shown in FIGS. 19 and 20, the protrusions 41 to 44 may be formed on the mutually facing other end portions 7*c* and 9*c* of the stage portions 7 and 9, and on the side end portions 7*e* and 9*f* of the stage portions 7 and 9. The protrusions 41 and 42 (43 and 44) which are formed on the same stage portion 7 (9) mutually protrude out at an angle of 90°.

Figure 21:
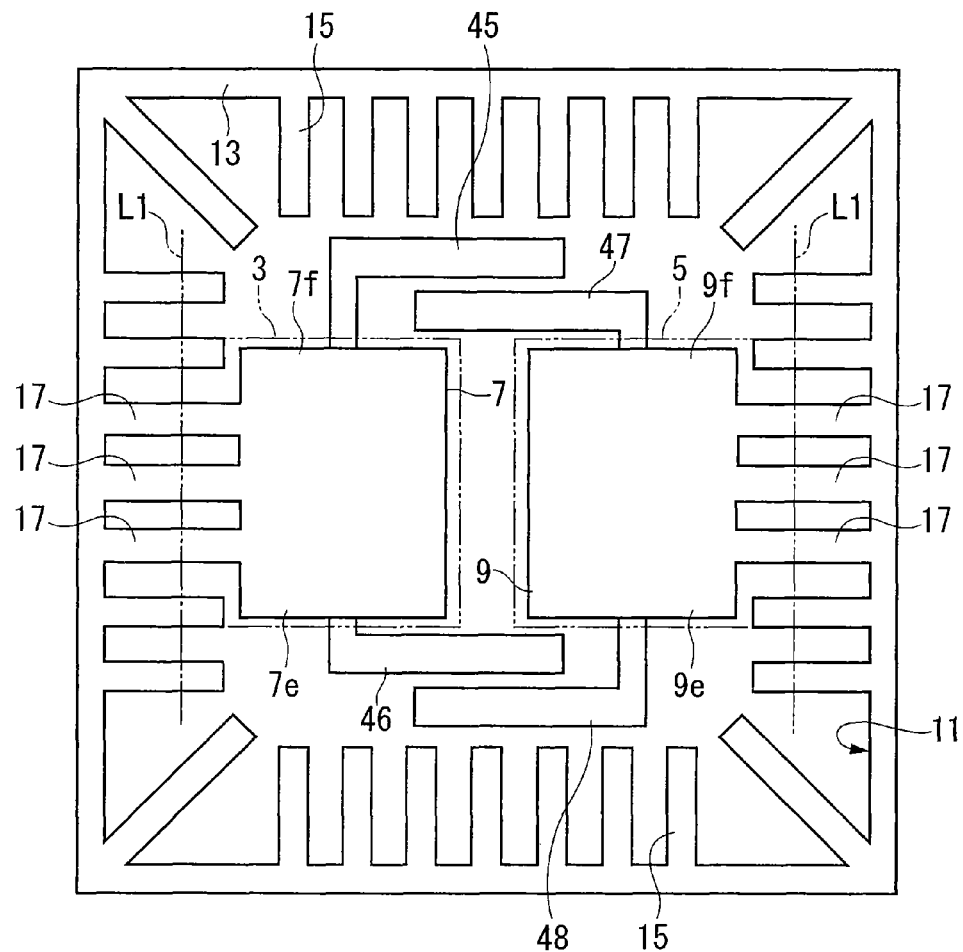
FIG. 21 is a plan view showing the protrusions according to a second alternative example of the first example of the present invention.
Figure 22:
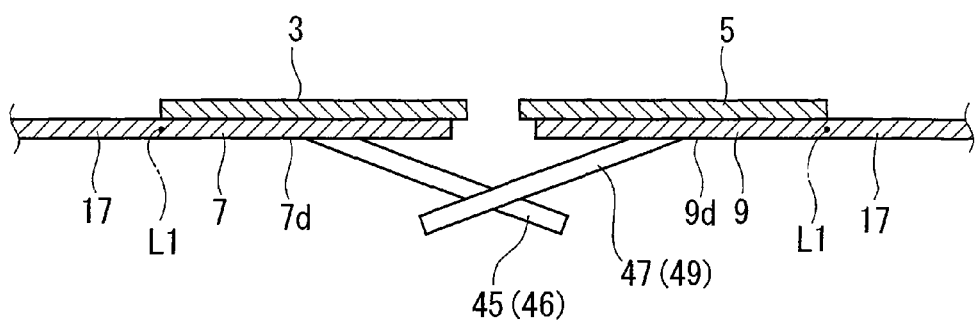
FIG. 22 is a side cross-sectional view showing a state where a magnetic sensor chip has been installed on the lead frame shown in FIG. 21.

Moreover, as shown in FIGS. 21 and 22, pairs of protrusions 45 to 48 may be provided which are formed on the side end portions 7*e*, 7*f*, 9*e*, and 9*f*, and which extend from the side end portions 7*e*, 7*f*, 9*e* and 9*f* towards the direction in which the two stage portions 7 and 9 are aligned. It is preferable for the protrusions 45 and 47 (46 and 48) which are formed on the same side end portion 7*e* and 9*e* (7*f* and 9*f*) side to be positioned side by side in the width direction of the stage portions 7 and 9.

Furthermore, as shown in FIG. 23 to 28, the protrusions 49 to 56 may be formed by cutting the stage portions 7 and 9 in an approximate letter-C shape, and applying a bending process to the rectangular notch portion.

Figure 23:
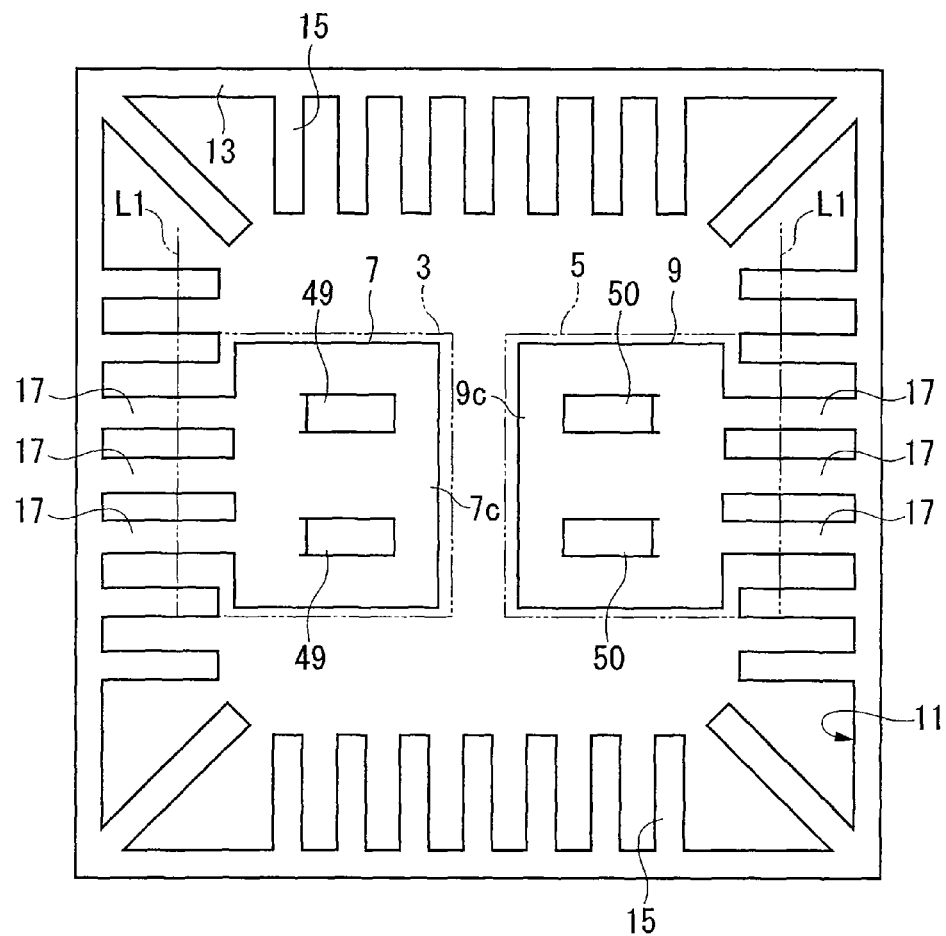
FIG. 23 is a plan view showing a third alternative example of the protrusions according to the first example of the present invention.
Figure 24:
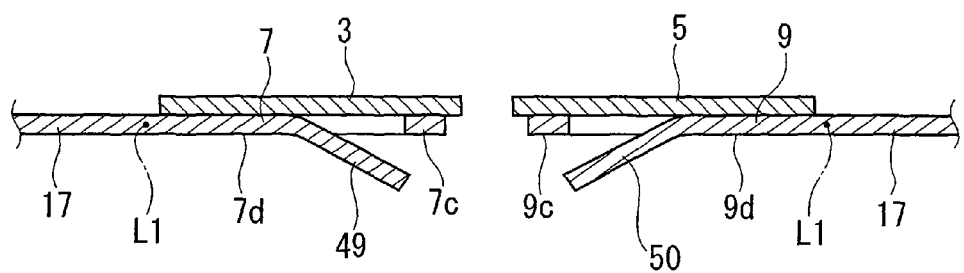
FIG. 24 is a side cross-sectional view showing a state where a magnetic sensor chip has been installed on the lead frame shown in FIG. 23.
Figure 25:
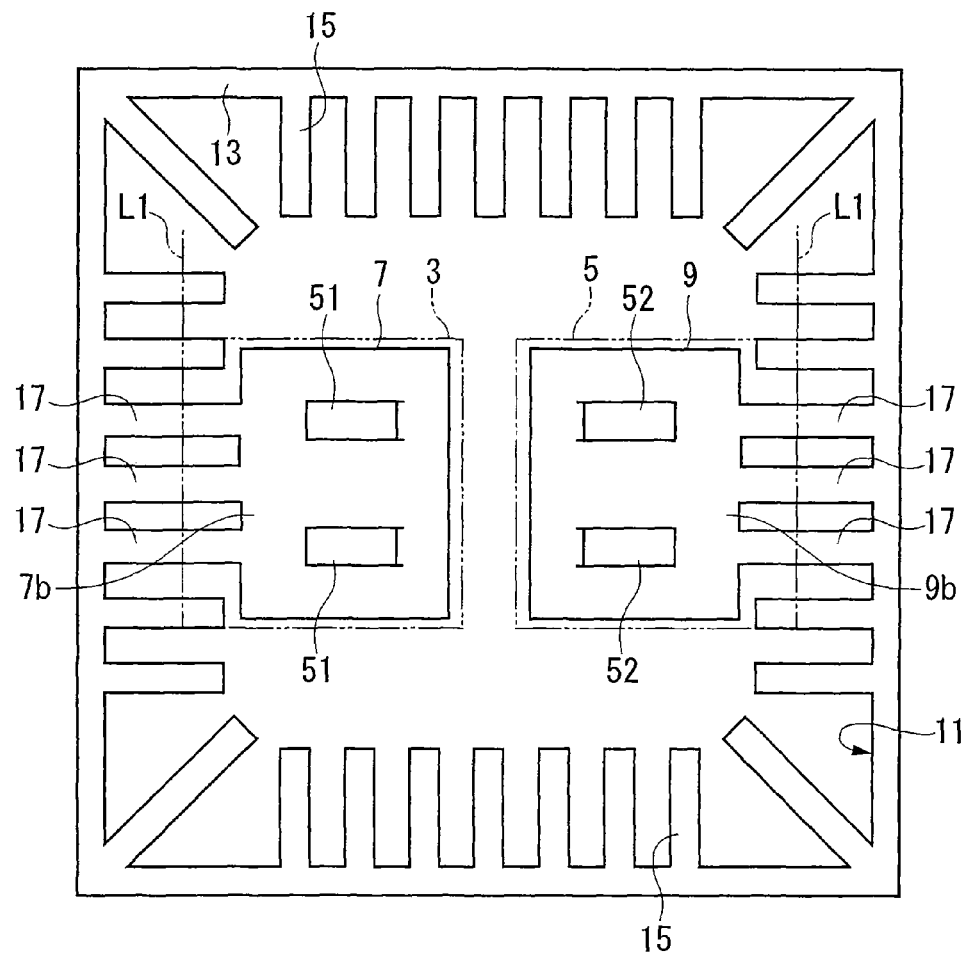
FIG. 25 a plan view showing a fourth alternative example of the protrusions according to the first example of the present invention.
Figure 26:
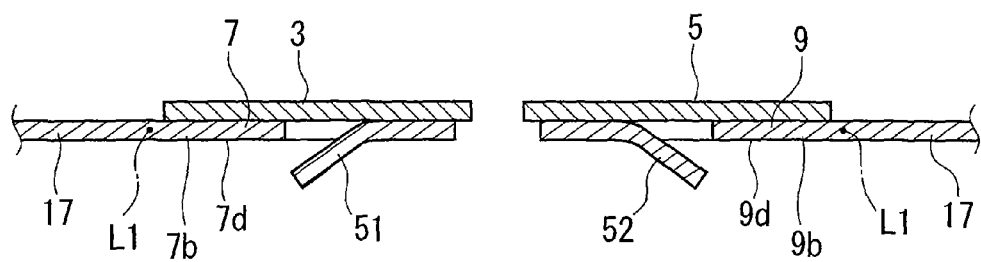
FIG. 26 is a side cross-sectional view showing a state where a magnetic sensor chip has been installed on the lead frame shown in FIG. 25.

In this configuration, as shown in FIG. 23 and 24, the protrusions 49 and 50 may protrude out on the other end portions 7*c* and 9*c* side of the stage portions 7 and 9. Furthermore, as shown in FIG. 25 and 26, the protrusions 51 and 52 may protrude out on the one end portions 7*b* and 9*b* side of the stage portions 7 and 9.

Figure 27:
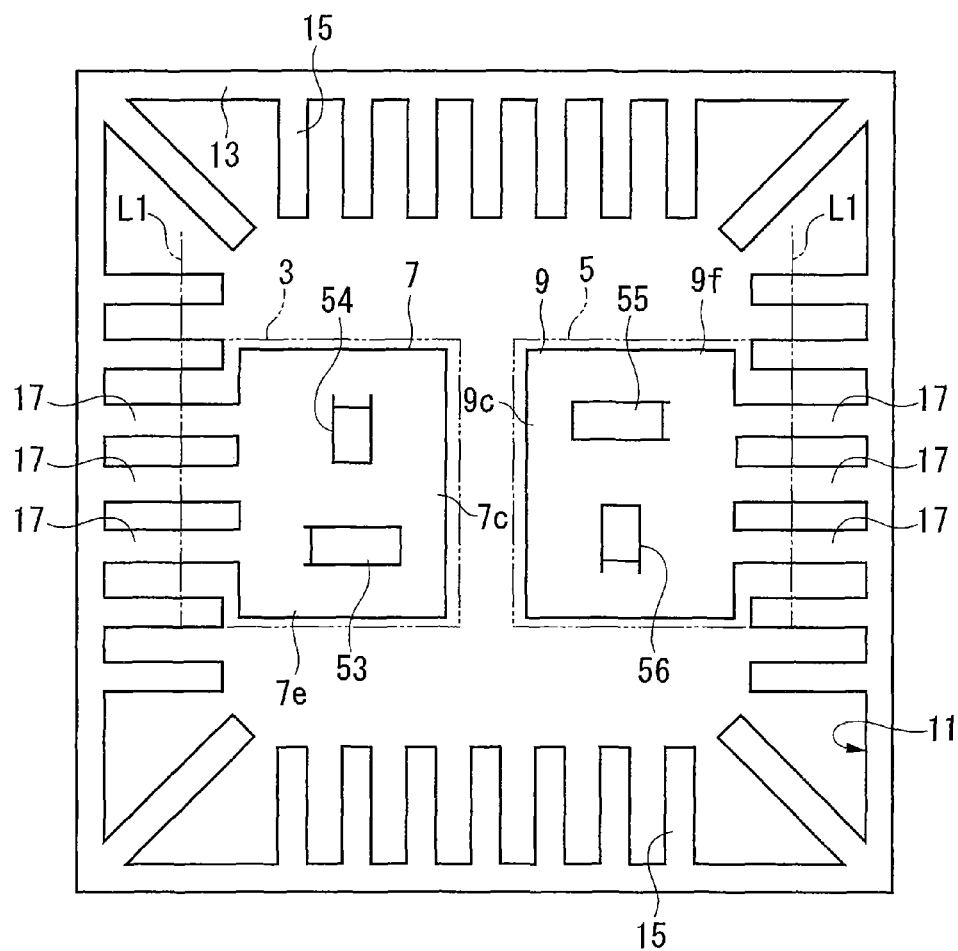
FIG. 27 is a plan view showing a fifth alternative example of the protrusions according to the first example of the present invention.
Figure 28:
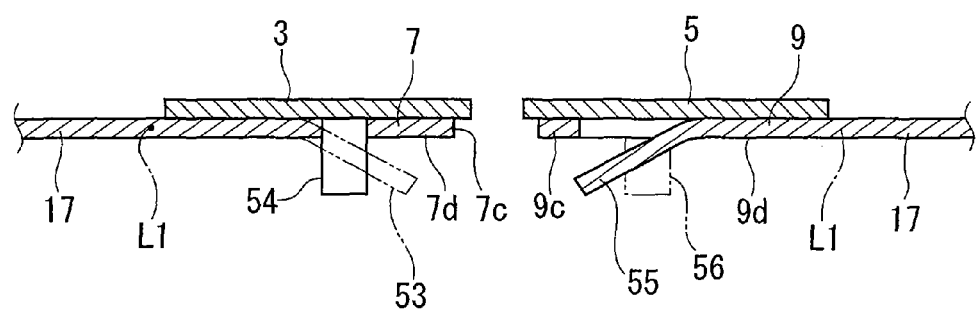
FIG. 28 is a side cross-sectional view showing a state where a magnetic sensor chip has been installed on the lead frame shown in FIG. 27.

Moreover, as shown in FIGS. 27 and 28, the two protrusions 53 and 54 (55 and 56) formed on the same stage portion 7 (9) may be made to mutually protrude at an angle of 90°. Here, one of the protrusions 53 and 55 is made to protrude on the other end portion 7*c* and 9*c* side of the stage portions 7 and 9, and the other protrusion 54 and 56 is made to protrude on the side end portion 7*e* and 9*f* side of the stage portions 7 and 9.

In the case of these configurations, since the protrusions 49 to 56 are not formed extending outwards of the stage portions 7 and 9, even if the areas of the magnetic sensor chips 3 and 5, and the stage portions 7 and 9 become large, it becomes possible to achieve further miniaturization of the magnetic sensor.

As mentioned above, in the case where the stage portions 7 and 9 are inclined using the protrusions 19, 21, and 41 to 56, based on the inclination angle of the stage portions 7 and 9 which is made the target, the dimensions of each part of the stage portions 7 and 9, and the protrusions 19, 21, and 41 to 56, can be determined by the formula (1) below.

$$(t/2+h0)+L4 \sin \theta 1 = L5 \sin(180° - \theta 1 - \theta 2) \quad (1)$$

Figure 29:
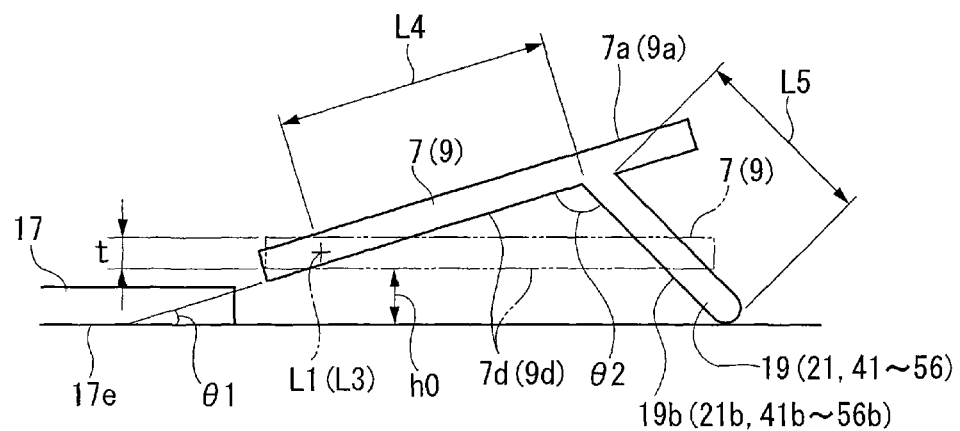
FIG. 29 is an outline side view showing the dimensions of each part of the lead frame according to the examples of the present invention.

As shown in FIG. 29, in this formula (1), t represents the thickness dimension of the stage portions 7 and 9, h0 represents the distance from the back face 17*e* of the connecting leads 17 to the back faces 7*d* and 9*d* of the stage portions 7 and 9 before the stage portions 7 and 9 are inclined, or in other words, represents the displacement amount in the thickness direction of the stage portions 7 and 9 with respect to the connecting leads 17.

Furthermore, L4 extends perpendicularly to the principal axis lines L1 and L3, along the surfaces 7*a* and 9*a* of the stage portions 7 and 9, and represents the stage portion length until the base end portions of the protrusions 19, 21, and 41 to 56 are reached. L5 represents the protrusion length from the base end portions of the protrusions 19, 21, and 41 to 56 to the end portions. The base end portions of the protrusions 19, 21, and 41 to 56 in formula (1) represent the locations where the back faces 7*d* and 9*d* of the stage portions 7 and 9 and the back faces 19*b*, 21*b*, and 41*b* to 56*b* of the protrusions 19, 21, and 41 to 56 intersect Moreover, θ1 represents the inclination angle of the back faces 7*d* and 9*d* of the stage portions 7 and 9 with respect to the back faces 17*e* of the connecting leads 17. Furthermore, θ2 represents the bending angle of the back faces 19*b*, 21*b*, and 41*b* to 56*b* of the protrusions 19, 21, and 41 to 56 with respect to the back faces 7*d* and 9*d* of the stage portions 7 and 9.

In the formula (1), (t/2+h0) represents the distance from the back faces 17*e* of the connecting leads 17 to the principal axis lines L1 and L3 relating to the direction of thickness of the metallic thin plate. However, since (t/2) is sufficiently small with respect to L1 (L1:t=10:1), it does not have an effect on the inclination angle θ1 or the bending angle θ2.

The calculation results for the stage portion length L4 from the protrusion length L5 and the bending angle θ2 using this formula (1) are shown below. The values shown below are results where in each case the inclination angle θ1 is made to be 15°, the displacement amount h0 is made to be 0 mm, and the thickness t of the stage portions 7 and 9 is ignored (t=0 mm).

For example, in the lead frame as shown in FIG. 19, where the protrusions 41 and 42 (43 and 44) which are formed on the same stage portion 7 (9) are made to mutually protrude at an angle of 90°, when the protrusion length L5 is made to be 0.5 mm, and the bending angle θ2 is made to be 90°, the stage portion length L4 becomes 1.87 mm.

Furthermore, in the lead frame as shown in FIG. 21, which has pairs of protrusions 45 to 48 extending from the side end portions 7*e*, 7*f*, 9*e* and 9*f* in the direction in which the two stage portions 7 and 9 are aligned, when the protrusion length L5 is made to be 0.7 mm, and the bending angle θ2 is made to be 120°, the stage portion length L4 becomes 1.91 mm.

Moreover, in the lead frame as shown in FIG. 23, which has protrusions 49 and 50 which are provided within the stage portions 7 and 9 and which protrude out on the other end portion 7*c* and 9*c* side of the stage portions 7 and 9, when the protrusion length L5 is made to be 0.5 mm, and the bending angle θ2 is made to be 120°, the stage portion length L4 becomes 1.37 mm.

As in the lead frames shown in FIGS. 19 and 27, in the case where a plurality of protrusions 41 to 44, and 53 to 56 are provided on the stage portions 7 and 9, and the stage portion length L4 is different for each protrusion 41 to 44, and 53 to 56, it is necessary to calculate the protrusion length L5 for each protrusion 41 to 44, and 53 to 56.

In the above-mentioned example, although the stage portions 7 and 9 were formed in a plan view approximate rectangular shape, it is in no way restricted to this. It is acceptable as long as the stage portions 7 and 9 are at least a shape in which the magnetic sensor chips 3 and 5 can adhere to the surfaces 7*a* and 9*a*. That is to say, the stage portions 7 and 9 may, for example, be formed in a plan view circular shape or oval shape, and may also be a form in which holes penetrating in the direction of thickness have been provided, or a mesh form.

Furthermore, although the stage portions 7 and 9 are inclined using the protrusions 41 to 44, and 53 to 56, it is in no way restricted to this. It is acceptable, if at the very least, in a stage where production of the magnetic sensor is completed, the two magnetic sensor chips 3 and 5 are mutually inclined.

In the manner of the configuration mentioned above, in the case where the magnetic sensor chips 3 and 5 protrude out on the connecting leads 17 side more than the principal axis lines L1 and L3, when the stage portions 7 and 9 are inclined, the magnetic sensor chips 3 and 5 move in a direction which approaches the connecting leads 17. Consequently, at the time of this inclining, the position of the magnetic sensor chips 3 and 5 on the surfaces 7*a* and 9*a* of the stage portions 7 and 9 are adjusted such that the magnetic sensor chips 3 and 5 do not come into contact with the connecting leads 17, and it is preferable for the length of the magnetic sensor chips 3 and 5, which protrude from the one end portions 7*b* and 9*b* of the stage portions 7 and 9, to be adjusted.

Figure 30:
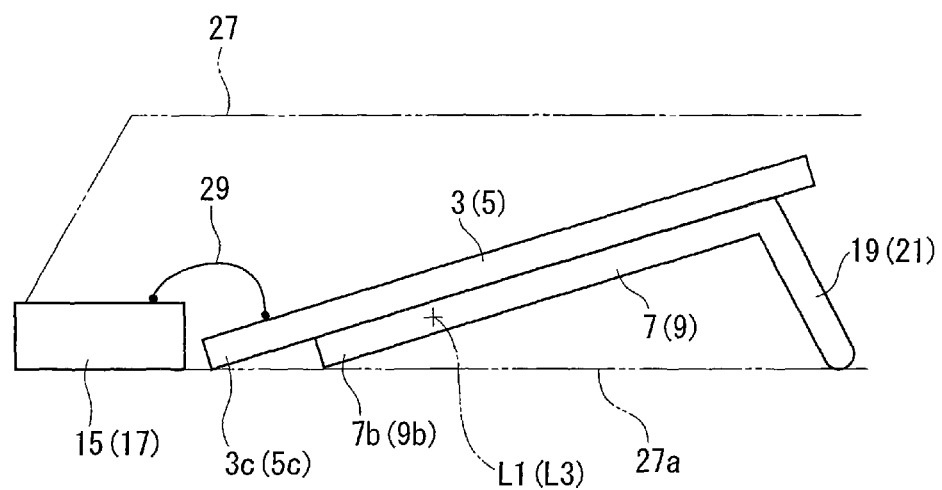
FIG. 30 is a side cross-sectional view showing a magnetic sensor according to the examples of the present invention.

Furthermore, as shown in FIG. 30, in the case where the one end portions 7*b* and 9*b* of the stage portions 7 and 9 are located more on the connecting leads 17 side than the principal axis lines L1 and L3, at the time when the stage portions 7 and 9 are inclined, the one end portions 7*b* and 9*b* move in a direction which approaches the bottom surface 27*a* side of the resin mold portion 27. Consequently, it is preferable at the time of this inclining, for the lengths along the surfaces 7*a* and 9*a* of the stage portions 7 and 9 from the principal axis lines L1 and L3 until the one end portions 7*b* and 9*b* to be adjusted, such that the one end portions 7*b* and 9*b* of the stage portions 7 and 9 do not come into contact with the bottom surface 27*a*.

As mentioned above, regarding the adjustment of the length of the magnetic sensor chips 3 and 5 which protrude out from the one end portions 7*b* and 9*b* of the stage portions 7 and 9, it can also be applied in the case where the magnetic sensor chips 3 and 5 and the connecting leads 17 do not overlap in the direction of thickness. That is to say, for example, in the case where the magnetic sensor chips 3 and 5 protrude more on the leads 15 side than the principal axis lines L1 and L3, at the time when the stage portions 7 and 9 have been inclined, the magnetic sensor chips 3 and 5 move in a direction which approaches the bottom surface 27*a* of the resin-mold portion 27. Consequently, it is preferable at the time of this inclining, for the length of the magnetic sensor chips 3 and 5 which protrude from the one end portions 7*b* and 9*b* along the surfaces 7*a* and 9*a* of the stage portions 7 and 9 to be adjusted, such that the end portions 3*c* and 5*c* of the magnetic sensor chips 3 and 5 do not come into contact with the bottom surface 27*a* of the resin mold portion 27.

Moreover, in the above-mentioned example, although the two magnetic sensor chips 3 and 5 are each inclined about the mutually parallel principal axis lines L1 and L3, it is in no way restricted to this. For example, the two magnetic sensor chips 3 and 5 may each be inclined about mutually perpendicular principal axis lines. In this case, the two mutually perpendicular sensitive directions of the two magnetic sensor chips 3 and 5 (for example, the A and D directions in FIG. 6) form a plane parallel to the bottom surface 27*a* of the resin mold portion 27, and therefore, the magnetism along the bottom surface 27a can be measured with good accuracy.

Third Example

Next, a third example of the present invention is explained.

Figure 31:
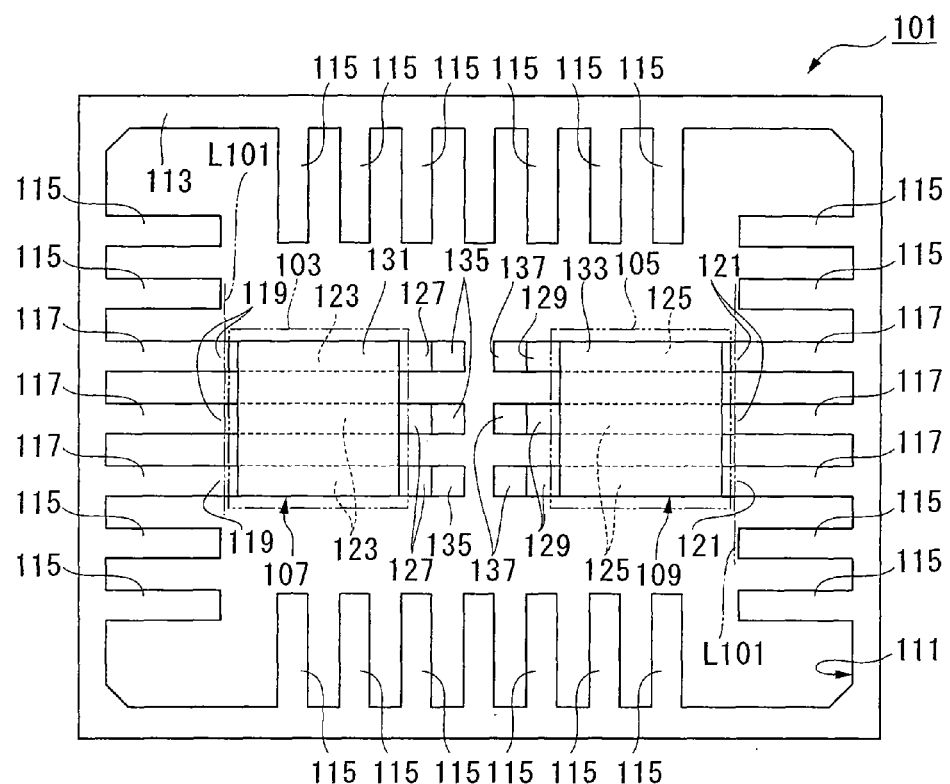
FIG. 31 is a plan view showing a lead frame according to a third example of the present invention.
Figure 32:
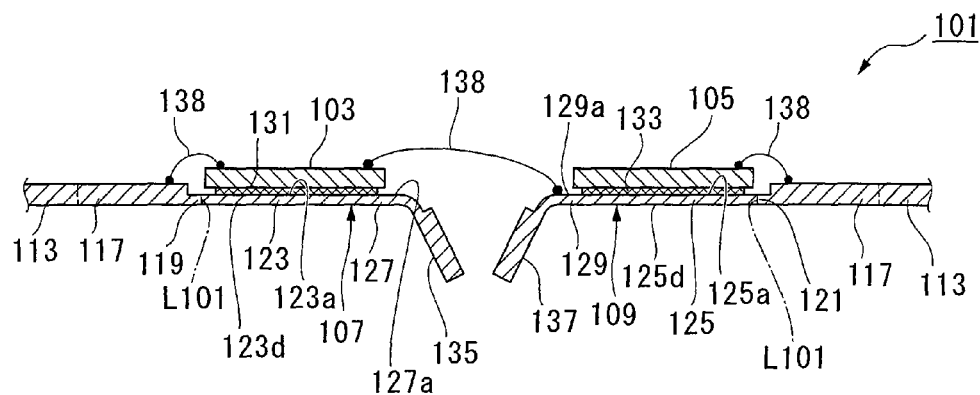
FIG. 32 is a side cross-sectional view showing a state where a magnetic sensor chip has been installed on the lead frame shown in FIG. 31.

As shown in FIGS. 31 and 32, a lead frame 101 comprises; two stage portions 107 and 109 for positioning the magnetic sensor chips (physical quantity sensor chips) 103 and 105, which have been formed in a plate form of a plan view rectangular shape, a frame portion 111 which supports the stage portions 107 and 109, and connection portions 119 and 121 which connect the stage portions 107 and 109 and the frame portion 111. The stage portions 107 and 109, the frame portion 111, and the connection portions 119 and 121 are integrally formed. The frame portion 111 comprises; a rectangular frame portion 113, which is formed in a frame form of a plan view rectangular shape such that it surrounds the stage portions 107 and 109, and a plurality of leads 115 and 117, which protrude from this rectangular frame portion 113 towards the interior. The connection portions 119 and 121 connect the stage portions 107 and 109 and the leads 117 (three of each in the present examples).

The leads 115 and 117 are electrically connected to the bonding pads (not shown in the drawings) of the magnetic sensor chips 103 and 105, and are positioned such that they are mutually separated. The two stage portions 107 and 109 are positioned in line along one side of the rectangular frame portion 113. The leads 117, which are connected to the stage portions 107 and 109, extend in the array direction of the two stage portions 107 and 109. The leads 117 connected to the stage portions 107 and 109 extend in mutually facing directions.

The stage portions 107 and 109 and the connection portions 119 and 121 are configured by a plurality of extension leads 123 and 125 which extend from the end of the leads 117, and the extension leads 123 and 125 are mutually separated. Protruding leads 127 and 129, which protrude towards the mutual stage portion 107 and 109, are formed on the ends of the mutually facing extension leads 123 and 125. These protruding leads 127 and 129 are integrally formed with the leads 117 which are connected to the stage portions 107 and 109. Furthermore, in a state where the magnetic sensor chips 103 and 105 are mounted on the stage portions 107 and 109, the protruding leads 127 and 129 do not overlap with the magnetic sensor chips 103 and 105.

A photoetching process is applied to the surfaces 123a, 125a, 127a, and 129a of the extension leads 123 and 125 and the protruding leads 127 and 129, and the thickness of the stage portions 107 and 109 and the connection portions 119 and 121 are formed thinner than the leads 117 and the protrusions mentioned below.

Of the surfaces 123a and 125a of the extension leads 123 and 125, sheet-like insulator films 131 and 133 are positioned one sheet each at locations which correspond to the stage portions 107 and 109. That is to say, the insulator films 131 and 133 are positioned over a plurality of extension leads 123 and 125. These insulator films 131 and 133 are formed from an electrically insulating material.

Adhesive layers (not shown in the drawings) are formed beforehand on the front face and the back face of the insulator films 131 and 133. The adhesive layers are formed in order to bond the stage portions 107 and 109 and the magnetic sensor chips 103 and 105 to both faces of the insulator films 131 and 133. The adhesive layers possess either a function of temporary adhesion, where it is possible to repeat sticking following adhesion, or permanent adhesion, where it is not possible to repeat sticking following adhesion. The insulator films 131 and 133 are stuck onto the stage portions 107 and 109. In this state, the magnetic sensor chips 103 and 105 can be adhered onto the surfaces 123a and 125a of the stage portions 107 and 109 through the insulator films 131 and 133.

On the end of the mutually facing protruding leads 127 and 129, protrusions 135 and 137, which protrude on the back face 123d and 125d side of the extension leads 123 and 125, are respectively formed.

In order to bend the protrusions 135 and 137 with respect to the extension leads 123 and 125 and the protruding leads 127 and 129, a photoetching process is applied to the base end portions of the protrusions 135 and 137, so that they are the same thickness as the stage portions 107 and 109. That is to say, the base end portions of the protrusions 135 and 137 are formed thinner than the other sections, so that they are deformable. As a result, it becomes possible to set the inclination angle of the protrusions 135 and 137 with respect to the stage portions 107 and 109 with good accuracy.

Figure 35:
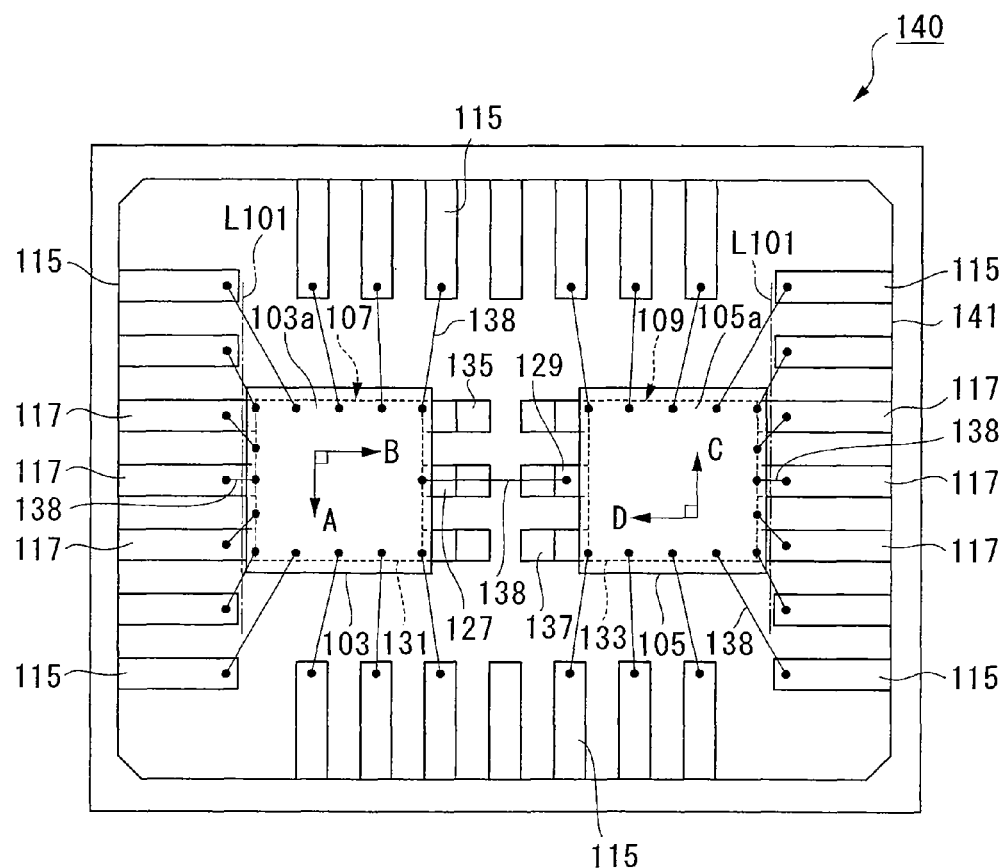
FIG. 35 is a plan view showing a magnetic sensor produced using the lead frame-shown in FIG. 31.

Next, a method of producing a magnetic sensor using the above-mentioned lead frame 101 is explained with reference to FIG. 35.

Firstly, the magnetic sensor chips 103 and 105 are bonded to the surfaces 123a and 125a of the stage portions 107 and 109 through the insulator films 131 and 133. Next, the bonding pads (not shown in the drawings) positioned on the surfaces of the magnetic sensor chips 103 and 105 and the leads 115 and 117 are electrically connected by bonding the wires 138. Furthermore, a wire 138 is bonded in the same manner between the bonding pad of the first magnetic sensor chip 103 and the surface 129a of the protruding lead 129 which is located on the stage portion 109 side, where the second magnetic sensor chip 105 is positioned.

In this case, the same lead 117 becomes electrically connected to the two magnetic sensor chips 103 and 105. However this lead 117 is used, for example as a ground electrode or the like, as an electrode which is shared between the two magnetic sensor chips 103 and 105.

In the step where the stage portions 107 and 109 are inclined, since the distance from the bonding section of the magnetic sensor chips 103 and 105 to the bonding section of the leads 115 and 117 changes, it is preferable for the material of these wires 138 to be easily bent and soft.

Next, the resin mold portion, which integrally fixes the magnetic sensor chips 103 and 105, the stage portions 107 and 109, and the leads 115 and 117, is formed.

Figure 33:
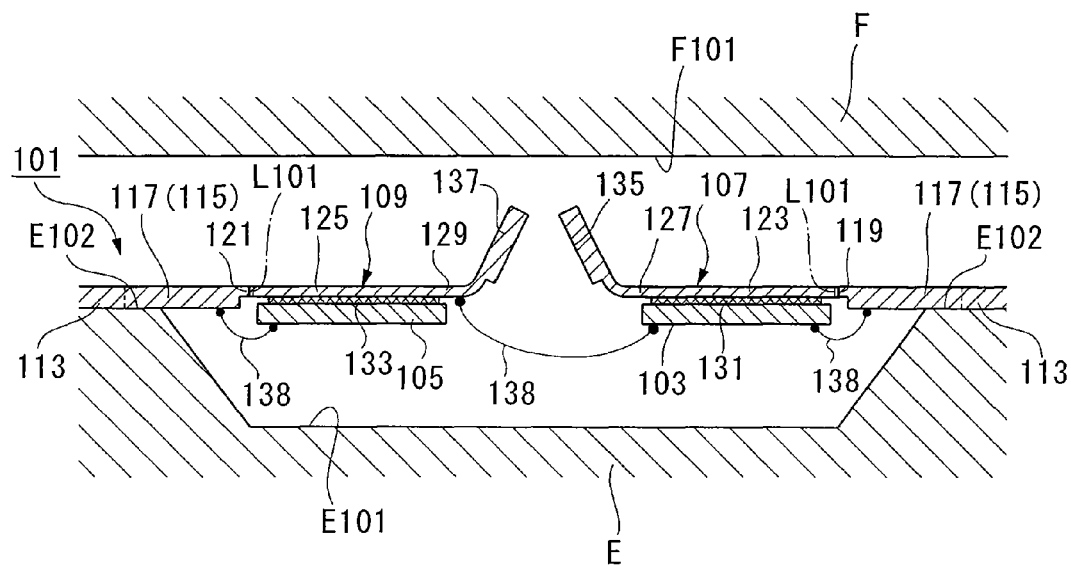
FIG. 33 is a side cross-sectional view showing a method of inclining the stage portion in the lead frame shown in FIG. 31.

That is to say, firstly, as shown in FIG. 33, the rectangular frame portion 113 of the lead frame 101 is positioned on the surface E102 of the metallic mold E, which has a concave portion E101. At this time, the leads 115 and 117, the stage portions 107 and 109, the magnetic sensor chips 103 and 105, and the protrusions 135 and 137, which are on the inside of the rectangular frame portion 113, are positioned on the upper side of the concave portion E101. Furthermore, the magnetic sensor chips 103 and 105, the stage portions 107 and 109, and the protrusions 135 and 137 are sequentially positioned from the concave portion E101 side towards the upper side.

A metallic mold F, which has a flat surface F101, is positioned on the upper side of the protrusions 135 and 137, and together with the aforementioned metallic mold E, sandwiches the rectangular frame portion 113 of the lead frame 101.

Figure 34:
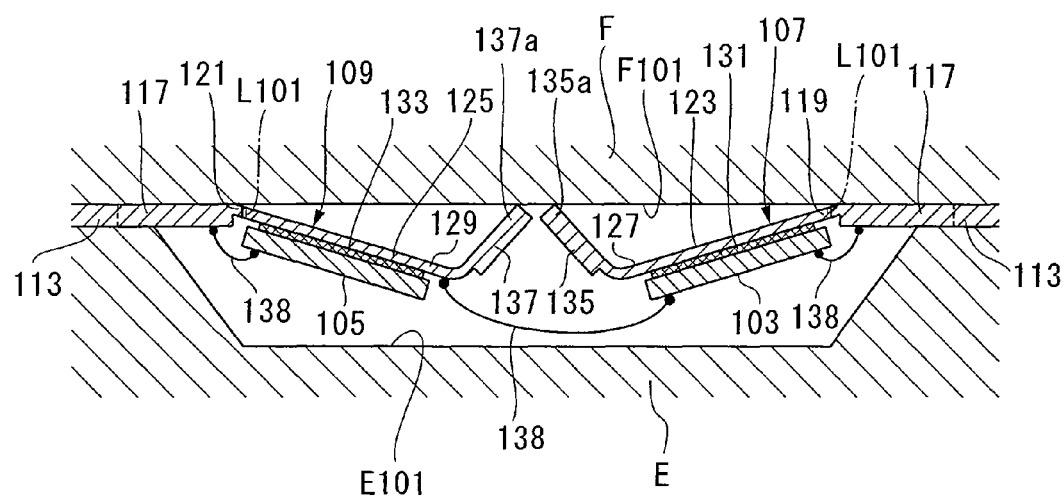
FIG. 34 is a side cross-sectional view showing a method of inclining the stage portion in the lead frame shown in FIG. 31.

As shown in FIG. 34, when the rectangular frame portion 113 is sandwiched by this top and bottom pair of metallic molds E and F, the end portions 135a and 137a of the protrusions 135 and 137 are pressed by the flat surface F101 of the metallic mold F. At this time, the connection portions 119 and 121, which are connected to the stage portions 107 and 109, are deformed, and the stage portions 107 and 109 are inclined with respect to the leads 117 about the principal axis line L101, which mutually connects the connection portions 119 and 121. Here, since the connection portions 119 and 121 are formed thinner as a result of the photoetching process, to give easily deformed portions which can be easily deformed, the stage portions 107 and 109 incline. As a result, together with the stage portions 107 and 109, the magnetic sensor chips 103 and 105 incline at a fixed angle with respect to the rectangular frame portion 113 and the flat surface F101

Thereafter, in a state where the end portions 135a and 137a of the protrusions 135 and 137 are pressed by the flat surface F101 of the metallic mold F, a melted resin is injected into the metallic molds E and F, and the magnetic sensor chips 103 and 105 are embedded in the interior of the resin. Accordingly, as shown in FIG. 35 and 36, the magnetic sensor chips 103 and 105 are fixed in the interior of the resin mold portion 141 in a state where they are mutually inclined.

It is preferable for the resin used here to be a material with a high liquidity, such that the inclination angle of the magnetic sensor chips 103 and 105, and the stage portions 107 and 109, does not change due to flowing of the resin.

Lastly, the leads 115 and 117 are individually divided and electrically separated by clipping off the rectangular frame portion 113, and the production of the magnetic sensor 140 is completed.

Figure 36:
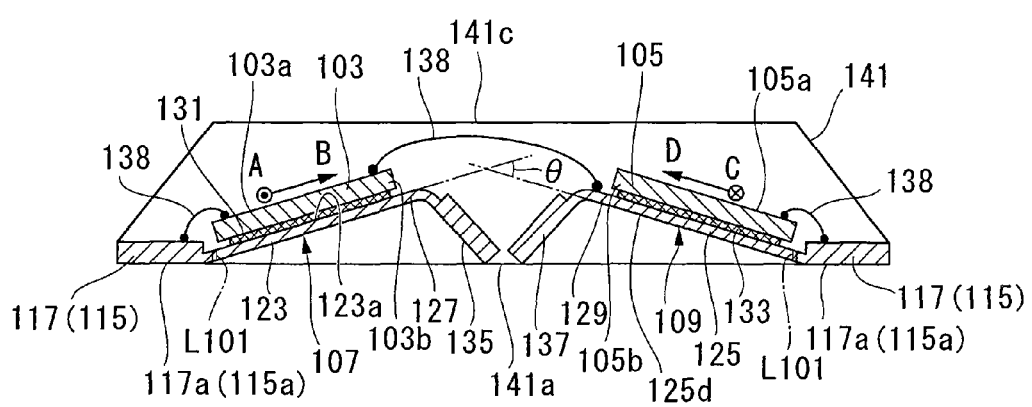
FIG. 36 is a side cross-sectional view showing the magnetic sensor shown in FIG. 35.

The magnetic sensor 140 which has been produced in the above manner, has as shown in FIG. 36, the same magnetic sensor chip 103 and 105 position relationship as explained in the first example. Furthermore, the magnetic sensor 140 has the same function as in the first example.

Moreover, in the above-mentioned lead frame 101 and magnetic sensor 140, since the insulator films 131 and 133 are provided between the magnetic sensor chips 103 and 105 and the stage portion 107 and 109, the leads 117 connected to the magnetic sensor chips 103 and 105 and the stage portions 107 and 109 are electrically insulated. Consequently, the electrical connection of the magnetic sensor chips 103 and 105 resulting from the aforementioned wire bonding can be performed not only by the leads 115, but also by using the leads 117 which configure the stage portions 107 and 109. That is to say, the number of leads which can be electrically connected to the magnetic sensor chips 103 and 105 can be increased without causing an increase in the size of the lead frame 101 resulting from an increase in the number of leads 115.

That is to say, the leads 17 which were used for connecting with the stage portions 7 and 9 in the first example can be used for electrical connections with the magnetic sensor chips 103 to 105 of the present example. Accordingly, it becomes possible to perform more input and output with respect to the magnetic sensor chips 3 and 5, and as a result, provision of a high-functionality magnetic sensor 40 becomes possible.

Furthermore, the need to separately provide leads in the frame portion 111 exclusively for connecting with the stage portions 107 and 109 is eliminated. Compared with the case where leads are provided exclusively for connections, the size of the frame portion 111, which surrounds the stage portions 107 and 109, can be made smaller, and miniaturization of the magnetic sensor 40 can be achieved.

Moreover, the wire 138 is bonded between the bonding pad of the first magnetic sensor chip 103 and the surface 129a of the protruding lead 129 which is located on the stage portion 109 side which mounts the second magnetic sensor chip 105, so that the same lead 117 can be electrically connected to the two magnetic sensor chips 103 and 105. Consequently, the number of leads 117 used for electrical connections with the magnetic sensor chips 103 and 105 can be decreased, and further miniaturization of the magnetic sensor 140 can be achieved.

Furthermore, when the stage portions 107 and 109, and the magnetic sensor chips 103 and 105 are inclined with respect to the frame portion 111 about the principal axis line L101, the distance between the one end portion 103b of the first magnetic sensor chip 103 and the protruding lead 129 on the second magnetic sensor chip 105 side does not change greatly. Accordingly, the wire 138 connected to the protruding lead 129 can be formed short, and production cost reduction of the magnetic sensor 140 can be achieved.

Moreover, since the stage portions 107 and 109 and the connection portions 119 and 121 are formed with the extension leads 123 and 125, which achieve the same form as the leads 117, simplification of the form of the lead frame 101 can be achieved. Accordingly, production cost reduction of the lead frame 101 and the magnetic sensor 140 can be achieved.

Furthermore, the magnetic sensor chips 103 and 105 are bonded to the surfaces 123a and 125a of the stage portions 107 and 109 using the insulator films 131 and 133, which have an adhesive layer. Therefore, compared to the case where, as is done conventionally, an adhesive is applied, improvement in the accuracy of the thickness of the adhesive layer can be easily achieved. Accordingly, inclining of the magnetic sensor chips 103 and 105 with respect to the surfaces 123a and 125a of the stage portions 107 and 109 due to dispersion in the thickness of the adhesive can be suppressed.

Moreover, in the case where a liquid adhesive is used for the bonding of the stage portions 107 and 109 and the magnetic sensor chips 103 and 105, there is concern of liquid dripping occurring, and the liquid adhesive adhering to the leads 117 and the surfaces 127a and 129a of the protruding leads 127 and 129. In the present example, by using insulator films 131 and 133 which possess an adhesive layer, adhesion of the adhesive onto the leads 117 and the surfaces of the protruding leads 127 and 129 does not arise. Accordingly, it becomes possible to easily produce the magnetic sensor 40.

Figure 37:
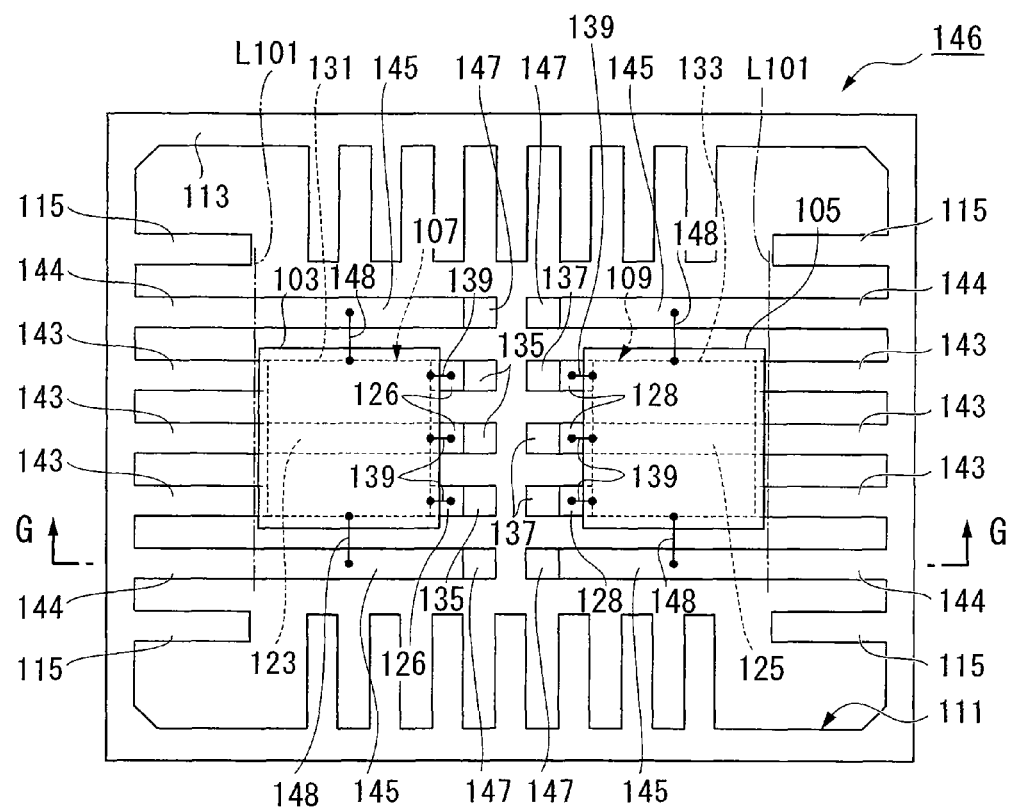
FIG. 37 is a plan view showing a state where a magnetic sensor chip has been installed on the lead frame according to an alternative example of the third example of the present invention.
Figure 38:
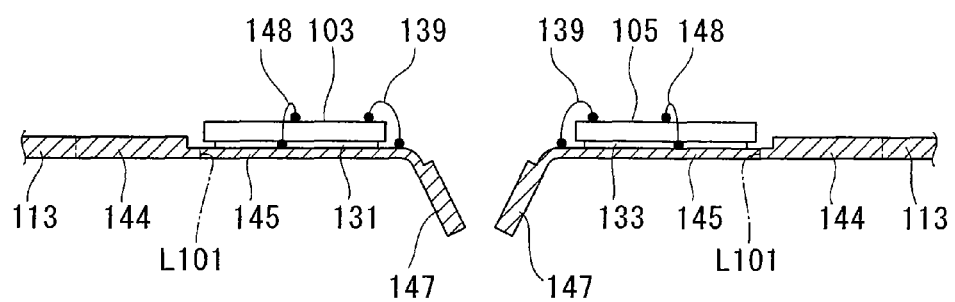
FIG. 38 is a cross-sectional view on the arrows G-G in FIG. 37.

In the above-mentioned example, although an example where leads 117 connected to the stage portion 109 were electrically connected to the magnetic sensor chip 103 installed on another stage portion 107 by a wire 138 was shown, it is in no way restricted to this. For example, as shown in FIGS. 37 and 38, the interval between the magnetic sensor chips 103 and 105 installed on the stage portions 107 and 109 and the protruding leads 126 and 128, which extend from the same stage portion, may be electrically connected by wires 139. These protruding leads 126 and 128 are formed in an area on the ends of the extension leads 123 and 125 in an area which does not overlap with the magnetic sensor chips 103 and 105.

In the case of this configuration, after electrical connection of the protruding leads 126 and 128 and the magnetic sensor chips 103 and 105 by wire bonding, when the stage portions 107 and 109 are inclined with respect to the leads 117, the location relationship between the extension leads 123 and 125 and the protruding leads 126 and 128 does not change. As a result, deformation of the wires 139 which are connected between the magnetic sensor chips 103 and 105 and the protruding leads 126 and 128 can be prevented with certainty. Accordingly, the length of these wires 139 can be formed short beforehand, and production cost reduction of the magnetic sensor can be achieved.

Furthermore, since the physical quantity sensor chips 103 and 105 are electrically connected to the plurality of protruding leads 126 and 128 which configure the stage portions 107 and 109, the number of leads which can be electrically connected to the magnetic sensor chips 103 and 105 can be further increased. That is to say, since the plurality of leads connected to the stage portions 107 and 109 can be used for electrically connecting to each magnetic sensor chip 103 and 105, further miniaturization of the magnetic sensor can be achieved.

Moreover, in the above-mentioned third example, the extension leads 123 and 125 all function as the stage portions 107 and 109, although extension leads which do not function as the stage portions 107 and 109 may be provided.

That is to say, for example, as shown in FIGS. 37 and 38, the lead frame 146 has first leads 143 (same as the leads 117 shown in FIG. 31), which are connected to the extension leads 123 and 125 that form the stage portions 107 and 109. Furthermore, the lead frame 146 has second leads 144, which are aligned along the principal axis line L101 together with the leads 143. On the leads 144, adjacent leads 145 which extend from the ends thereof, are formed.

The adjacent leads 145 are positioned with a space between, and approximately parallel to, the extension leads 123 and 125, and their length is approximately equivalent to the length of the protruding leads 126 added to the length of the extension leads 123. On the end of the adjacent leads 145, protrusions 147 are formed in the same manner to the protrusions 135 and 137 formed on the ends of the protruding leads 126 and 128. These adjacent leads 145 are, in the same manner as the extension leads 123 and 125, bent with respect to the second leads 144 about the principal axis line L101, and can be inclined. That is to say, the adjacent leads 145 can be inclined in the same direction and at the same inclination angle as the extension leads 123 and 125.

When this lead frame 146 is used to produce the magnetic sensor, firstly, the magnetic sensor chips 103 and 105 and the adjacent leads 145 are electrically connected by wire bonding. Thereafter, the extension leads 123 and 125 and the adjacent leads 145 are inclined in the same direction as a result of the metallic molds pressing the protrusions 147. At this time, the relative distance between the adjacent leads 145 and the extension leads 123 and 125 is constantly maintained. That is to say, the wires 148, which electrically connect the magnetic sensor chips 103 and 105 and the adjacent leads 145, do not deform, and the length of these wires 148 can be formed short. Accordingly, production cost reduction of the magnetic sensor can be achieved.

Furthermore, since the adjacent leads 145 and the stage portions 107 and 109 can be inclined at the same inclination angle, a chip which is larger than the magnetic sensor chips 103 and 105 can be installed on the stage portions 107 and 109. That is to say, a larger chip can be supported by the adjacent leads 145. Accordingly, it is not necessary to change the design of the lead frame 146 according to the size of the magnetic sensor chip, and this lead frame 146 can be used generically. In this case, it is preferable to also provide the insulator films 131 and 133 between the magnetic sensor chips and the adjacent leads 145.

Moreover, since the adjacent leads 145 are the same form as the extension leads 123 and 125, the production of this lead frame 146 is easy.

Figure 39:
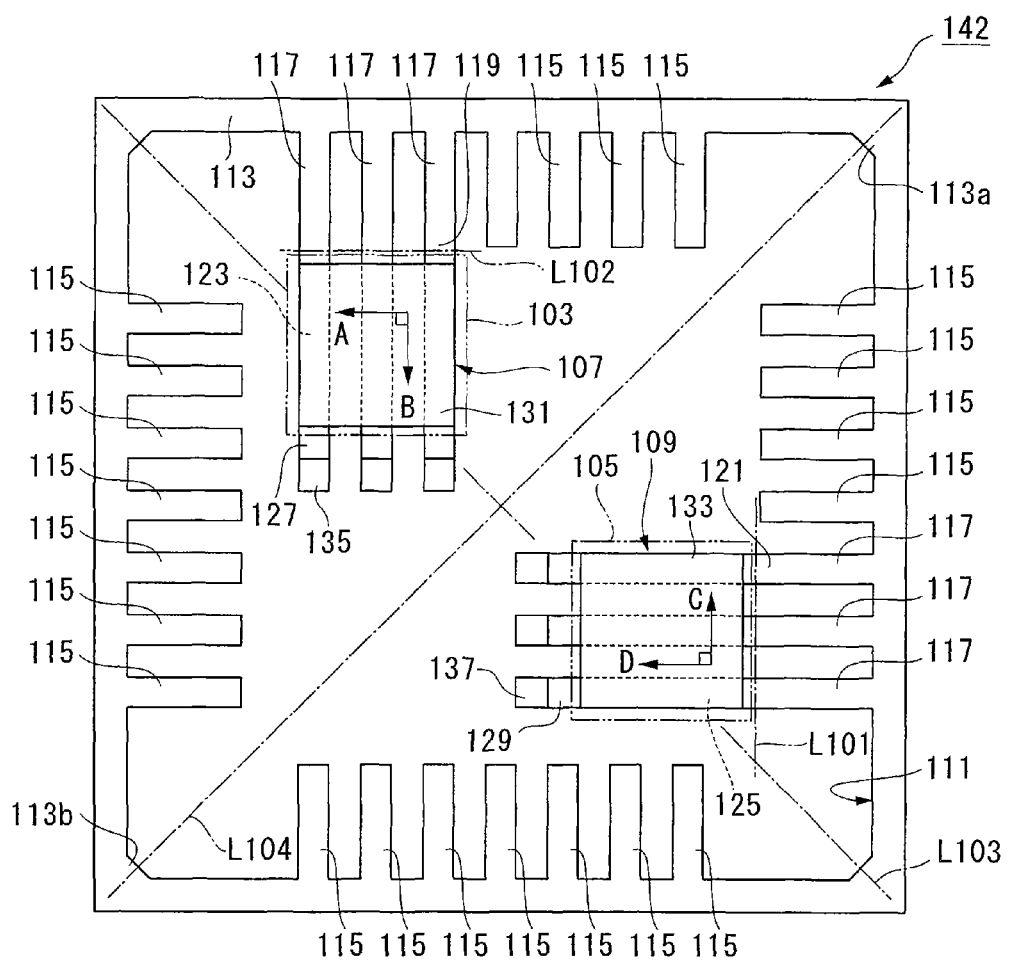
FIG. 39 is a plan view showing a lead frame according to another alternative example of the third example of the present invention.

Furthermore, although the lead frame 146 of the above-mentioned example was designed such that the two stage portions 107 and 109 were inclined about-mutually parallel principal axis lines L101, it is in no way restricted to this. For example, as shown in FIG. 39, it may be designed such that the two stage portions 107 and 109 are inclined about mutually perpendicular principal axis lines L101 and L102. In this configuration, the leads which form the stage portions 107 and 109 are mutually perpendicular. In this case, the two mutually perpendicular sensitive directions of the two magnetic sensor chips 103 and 105 (the A direction and the D direction) are positioned within a plane parallel with the bottom surface 141*a* of the resin mold portion 141, and therefore, the magnetism along the bottom surface 27*a* can be measured with accuracy.

Furthermore, in the configuration shown in FIG. 39, the two magnetic sensor chips 103 and 105 are aligned along one of the diagonal lines L103 of the rectangular frame portion 113. In this configuration, when the stage portions 107 and 109, the magnetic sensor chips 103 and 105, and the leads 115 and 117 are integrally molded by the resin, the flow of the melted resin can be performed smoothly.

That is to say, when the resin mold portion 141 is formed by flowing in the melted resin into the resin formation space formed by the two metallic molds E and F, by flowing in the melted resin from one corner 113*a* of the rectangular frame portion 113, which is located on a diagonal line L104 which intersects the diagonal line L103, towards the other corner 113*b*, the stage portions 107 and 109 and the magnetic sensor chips 103 and 105 do not obstruct the flow of this melted resin.

Accordingly, the melted resin can be made to arrive smoothly from one corner 113*a* to the other corner 113*b*, and filling defects of the resin can be prevented with certainty. Furthermore, changes in the inclination angle of the stage portions 107 and 109 and the magnetic sensor chips 103 and 105 through reception of flow pressure as a result of the flow of the melted resin, can also be prevented. As a result, the inclination angle of the magnetic sensor chips 103 and 105 can be set with good accuracy.

Moreover, in this example, on the end of the leads 115, which are aligned together with the leads 117 which form the stage portions 107 and 109, the same leads as the adjacent leads 145 as was described in FIG. 37 may be provided.

Furthermore, an example using insulator films 131 and 133 in which adhesive layers were formed on the front face and the back face was shown. However, in the case where the thickness dimension of the adhesive layers is not considered, the configuration is not restricted to this, and the stage portions 107 and 109 and the magnetic sensor chips 103 and 105 may be bonded to the insulator film using an adhesive.

Moreover, the protrusions 135, 137 and 147 are not limited to being formed on the mutually facing stage portions 107 and 109 or the end portions of the adjacent leads 145, and it is acceptable if, at the very least, they protrude out on the back face 123*d* and 125*d* side of the stage portions 107 and 109.

Furthermore, although the stage portions 107 and 109 and the adjacent leads 145 were inclined using the protrusions 135, 137 and 147, it is in no way restricted to this. It is acceptable if at the very least, in the step where the production of the magnetic sensor 140 is completed, another method is used to incline the two magnetic sensor chips 103 and 105 and the adjacent leads 145.

Fourth Example

FIG. 40 to FIG. 45 show a fourth example of the present invention. The magnetic sensor (physical quantity sensor) according to this example is, in the same manner as in the aforementioned examples, one that measures the direction and magnitude of an external magnetic field by two mutually inclined magnetic sensor chips, and is one which is produced using a lead frame formed by applying a pressing process and an etching process to a thin plate form metallic plate made from a copper material.

Figure 40:
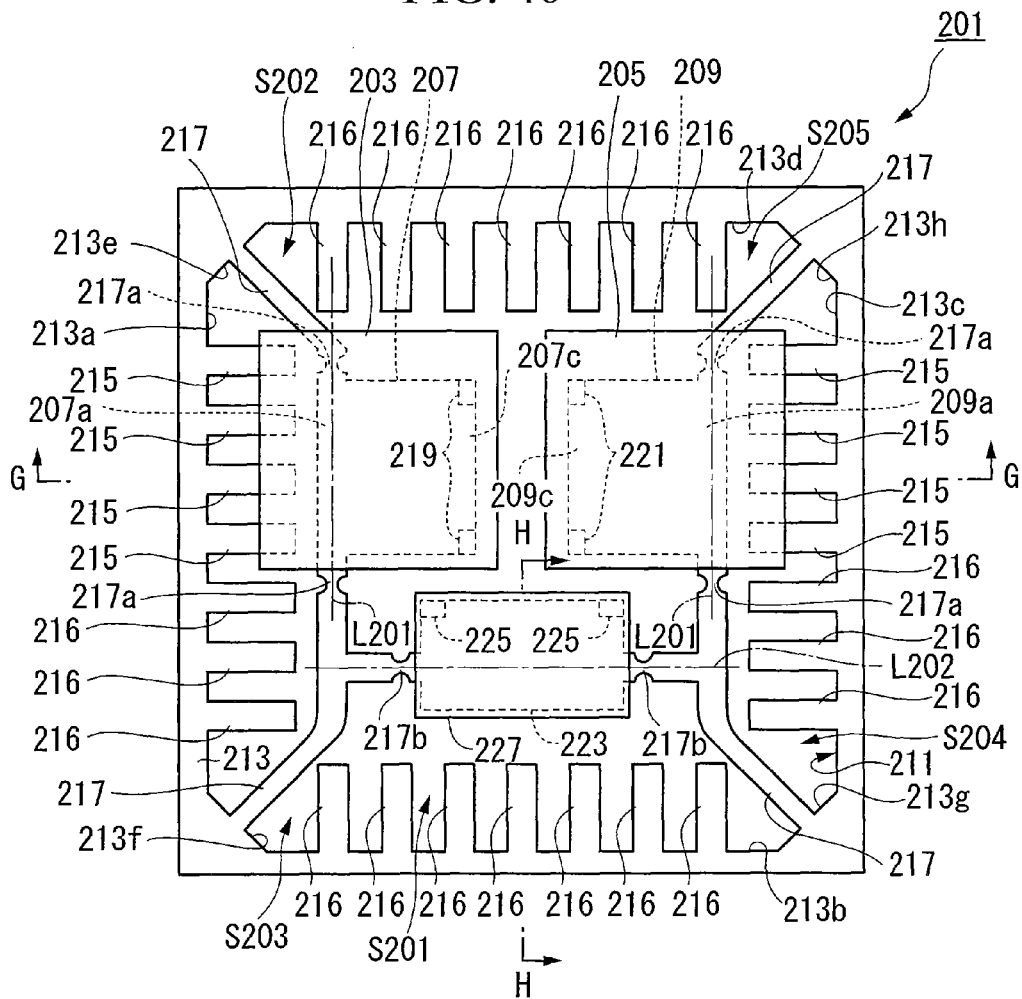
FIG. 40 is a plan view showing the lead frame and the magnetic sensor according to a fourth example of the present invention.
Figure 41:
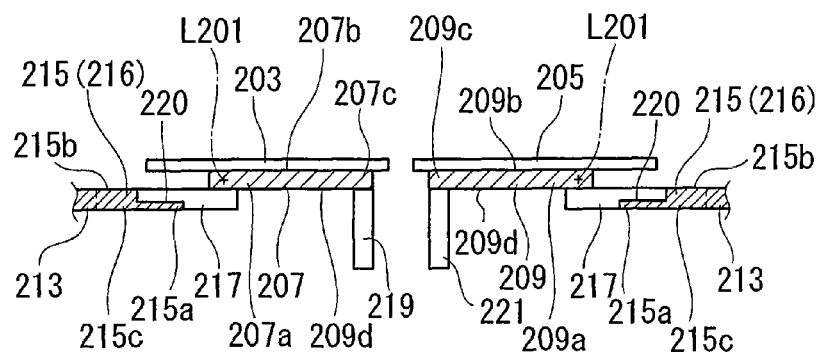
FIG. 41 is a cross-sectional view on the arrows G-G in FIG. 40.

The lead frame 201, as shown in FIG. 40 and FIG. 41, comprises; two stage portions 207 and 209 which mount the magnetic sensor chips (physical quantity sensor chips) 203 and 205, which have been formed in a plan view rectangular shape, and a frame portion 211 which supports the stage portions 207 and 209. These stage portions 207 and 209 and the frame portion 211 are integrally formed. The frame portion 211 comprises; a rectangular frame portion 213, which has been formed in a plan view approximate square frame form such that it surrounds the stage portions 207 and 209, a plurality of leads 215 and 216 which protrude from all sides 213a to 213d of the inner area S201 of this rectangular frame portion 213 to the inner side, and connecting leads (connection portions) 217 which protrude from all corners 213e to 213h of the inner area S201 to the inner side.

A plurality (seven each in the shown example) of leads 215 and 216 are provided for each of the sides 213a to 213d of the inner area S201. The leads 215 and 216 are provided in order to electrically connect to the bonding pads (not shown in the drawings) of the magnetic sensor chips 203 and 205. These leads 215 and 216 are only positioned on the midway portions of each of the sides 213a to 213d of the inner area S201, and are not provided on the end portions of each of the sides 213a to 213d, in order to avoid contact with the connecting leads 217 mentioned below. Near to the corners 213e to 213h of the inner area S201 are non-installation areas S202 to S205, where the leads 215 and 216 are not disposed.

The connecting leads 217 are hanging leads which connect the stage portions 207 and 209 and the rectangular frame portion 213. One end portion 217a of the connecting leads 217 is connected to the side end portion located on both ends of the one end portions 207a and 209a of the stage portions 207 and 209. Here, the side end portions of the stage portions 207 and 209 represent the end portions of the stage portions 207 and 209 which are perpendicular to the direction in which the two stage portions 207 and 209 are aligned. On one end portion 217a of the connecting leads 217, a concave notch is provided in the side face thereof, so that it is formed thinner than the other sections. This notch is a twisting portion which can be easily deformed when the stage portions 207 and 209 are bent and inclined about the axis line L201, which is parallel with the two mutually parallel sides 213a and 213c of the inner area S201.

The two stage portions 207 and 209 are positioned side by side along one side 213d of the inner area S201. Furthermore, the stage portions 207 and 209 are located displaced with respect to the leads 215 and 216 in the direction of thickness of the metallic thin plate (lead frame). The surfaces 207b and 209b of the stage portions 207 and 209 are each formed in a plan view approximate rectangular shape such that they mount magnetic sensor chips 203 and 205. These two stage portions 207 and 209 are each positioned in a location closer to the non-installation areas S202 and S205 than the non-installation areas S203 and S204, and the surfaces 207b and 209b thereof are smaller than the mounting faces of the magnetic sensor chips 203 and 205.

On the surfaces 215b of the leads 215, which are adjacent to the one end portions 207a and 209a of the stage portions 207 and 209, from the end portions 215a to the midway portions, a concave portion is formed by a photoetching process. That is to say, the thickness of the end portions 215a of the leads 215 is formed thinner than the base end portions 215c of the leads 215 located on the rectangular frame portion 213 side.

On the other end portions 207c and 209c of the stage portions 207 and 209, pairs of protrusions 219 and 221, which protrude on the back face 207d and 209d side of the stage portions 207 and 209, are respectively formed. These protrusions 219 and 221 are formed in order to incline the stage portions 207 and 209. The protrusions 219 of the stage portion 207 and the protrusions 221 of the stage portion 209 are mutually facing. In order to stably incline the stage portions 207 and 209, it is preferable to make the mutual interval between the pair of protrusions 219 and 221 formed on the stage portions 207 and 209 large.

Furthermore, in order to stabilize the inclination angle of the stage portions 207 and 209, it is desirable to make the width of the end portions of the pair of protrusions 219 and 221 wide. Consequently, since the area of the end portions which receives a pressing force when the stage portions 207 and 209 are inclined becomes larger, deformation of the protrusions 219 and 221 by stress relaxation is prevented, and the incline of the stage portions 207 and 209 is stabilized. Specifically, the pair of protrusions 219 and 221 may be made broader, and not a rod shape as is shown in the drawings. Alternatively, the end portions of the protrusions 219 and 221 may be bent into a rectangular shape.

Since the two stage portions 207 and 209 are positioned close to the same side 203d of the inner area S201, the inner area S201 located on the side 203b opposite this side 203d becomes a surplus area. In this surplus area, an approximate rectangular shape auxiliary stage portion 223 connected to the connecting leads 217 is formed.

Figure 42:
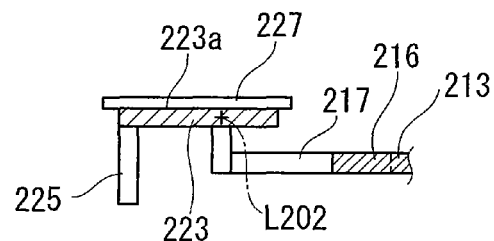
FIG. 42 is a cross-sectional view on the arrows H-H in FIG. 37.

This auxiliary stage portion 223 is, as shown in FIG. 42, in the same manner as the stage portions 207 and 209, located displaced in the direction of thickness of the metallic thin plate (lead frame 201). On the auxiliary stage portion 223, a twisting portion 217b for inclining about the axis line L202, which is perpendicular to the aforementioned axis line L201, and a pair of protrusions 225, are formed. On the surface 223a of the auxiliary stage portion 223, a magnetic sensor chip in the same manner as mentioned above, or a semiconductor chip 227 such as an acceleration sensor chip, a temperature sensor chip, or a signal processing LSI, is mounted. This semiconductor chip 227 is electrically connected to the leads positioned at the surroundings thereof.

Next, a method for producing a magnetic sensor using the above-mentioned lead frame 201 is explained.

As shown in FIG. 40 to FIG. 42, firstly, the magnetic sensor chips 203 and 205 and the semiconductor chip 227 are bonded to the surfaces 207b, 209b and 223a of the stage portions 207 and 209 and the auxiliary stage portion 223. The magnetic sensor chips 203 and 205 are positioned near the non-installation areas S202 and S205, such that the sides thereof become parallel with the sides 213a to 213d of the inner area S201. Furthermore, the magnetic sensor chips 203 and 205 protrude out from the surfaces 207b and 209b of the stage portions 207 and 209, although this protruding section is positioned to overlap with, among the plurality of leads 215 and 216 provided on the sides 213a and 213c of the inner area S201, the plurality of leads 215 (four in the shown example) located on the non-installation area S202 and S205 side. As shown in FIG. 41, since the stage portions 207 and 209 are displaced in the direction of thickness of the metallic thin plate (lead frame 201), the magnetic sensor chips 203 and 205 do not come into contact with the leads 215.

The magnetic sensor chips 203 and 205 are positioned in an area which spans from the end portions 215a to the midway portions of the leads, which has been thinly formed as a result of the aforementioned photoetching process. Furthermore, the magnetic sensor chips 203 and 205 are positioned such that they do not overlap with the leads 216 which have been lined up along the alignment direction (side 213d) of the stage portions 207 and 209.

Next, the bonding pads (not shown in the drawings) disposed on the surfaces of the magnetic sensor chips 203 and 205 and the semiconductor chip 227, and the leads 216, which do not overlap with the magnetic sensor chips 203 and 205, are electrically connected by wires (not shown in the drawings). In the step mentioned below, where the stage portions 207 and 209 and the auxiliary stage portion 223 are inclined, since the location relationship between the bonding sections of the magnetic sensor chip 203 and 205 and the semiconductor chip 227, and the bonding sections of the leads 216, changes, it is preferable for the material of these wires to be easily bent and soft.

Figure 43:
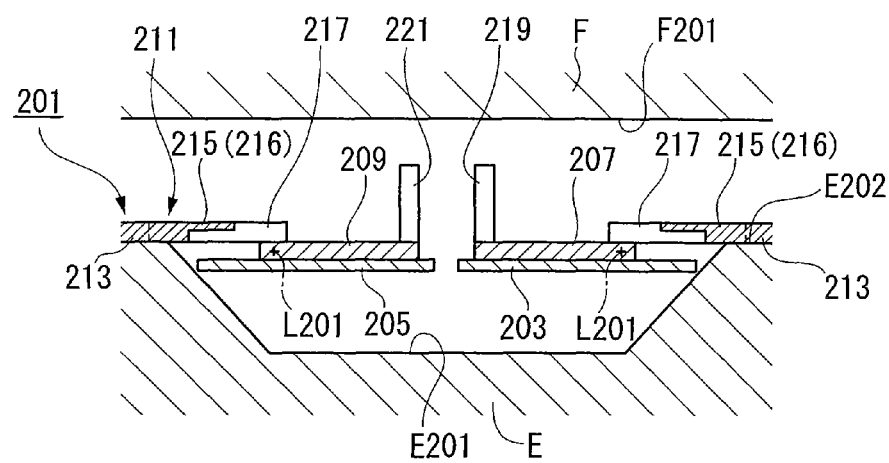
FIG. 43 is a side cross-sectional view showing a method of inclining the stage portion in the lead frame shown in FIG. 40.

Next, the resin mold portion (package), which integrally fixes the magnetic sensor chips 203 and 205, the semiconductor chip 227, the stage portions 207 and 209, the auxiliary stage portion 223, and the leads 215 and 216, is formed. That is to say, as shown in FIG. 43, the rectangular frame portion 213 of the lead frame 201 is positioned on the surface E202 of the metallic mold E, which has a concave portion E201. At this time, the leads 215 and 216, the stage portions 207 and 209, the magnetic sensor chips 203 and 205, and the protrusions 219 and 221, which are on the inside of the rectangular frame portion, are positioned on the upper side of the concave portion E201. That is to say, in this state, the magnetic sensor chips 203 and 205, the stage portions 207 and 209, and the protrusions 219 and 221 are positioned in sequence from the concave portion E201 side towards the upper side.

A metallic mold F, which has a flat surface F201, is positioned on the upper side of the protrusions 219 and 221, and together with the aforementioned metallic mold E, sandwiches the rectangular frame portion 213 of the lead frame 201.

Figure 44:
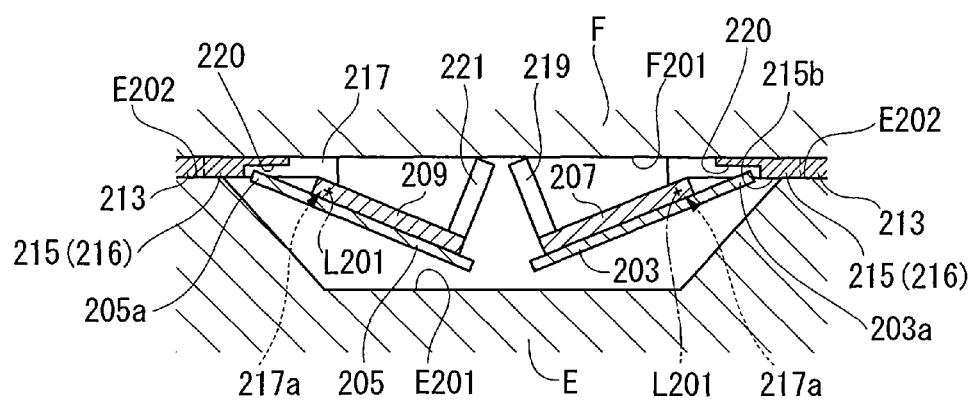
FIG. 44 is a side cross-sectional view showing a method of inclining the stage portion in the lead frame shown in FIG. 40.

As shown in FIG. 44, when the rectangular frame portion 213 is sandwiched by this pair of metallic molds E and F, the protrusions 219 and 221 are pressed by the flat surface F201 of the metallic mold F. As a result of this pressing force, one end portion 217a of the connecting leads 217 is bent about the axis line L201, inclining the stage portions 207 and 209. At this time, one end portion 203a and 205a of the magnetic sensor chips 203 and 205 which face the surfaces 215b of the leads 215 enters into the concave portion 220. Consequently, the magnetic sensor chips 203 and 205, together with the stage portions 207 and 209, are inclined at a fixed angle with respect to the rectangular frame portion 213 and the flat surface F201.

The auxiliary stage portion 223 is, in the same manner as the stage portions 207 and 209, inclined at a fixed angle with respect to the rectangular frame portion 213 and the flat surface F201 as a result of the protrusions 225 being pressed by the flat surface F201 of the metallic mold F.

Figure 45:
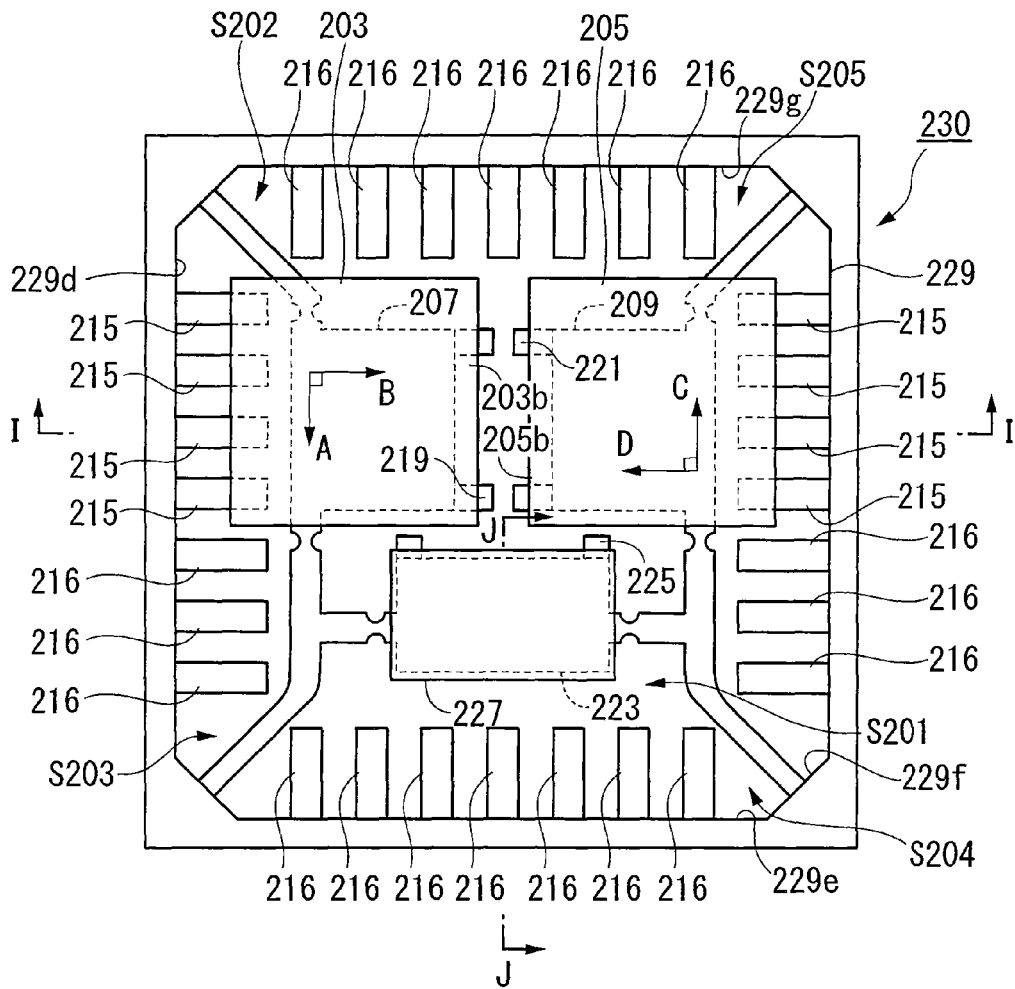
FIG. 45 is a plan view showing a magnetic sensor produced using the lead frame shown in FIG. 40.
Figure 46:
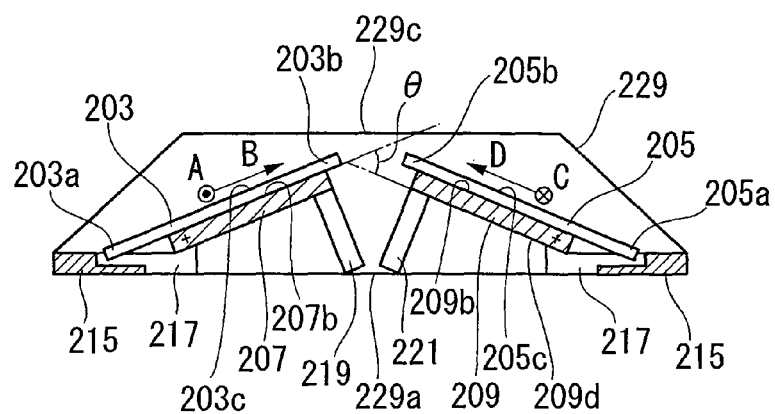
FIG. 46 is a cross-sectional view on the arrows I-I in FIG. 45.
Figure 47:
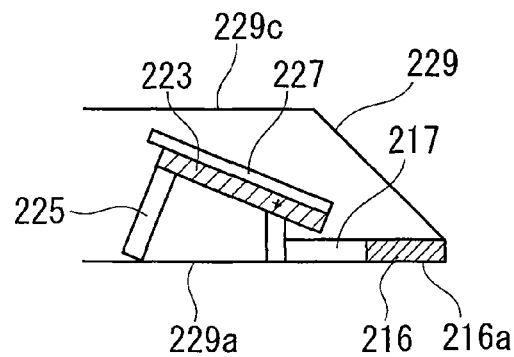
FIG. 47 is a cross-sectional view on the arrows J-J in FIG. 45.

Thereafter, in a state where the protrusions 219 and 221 are pressed by the flat surface F201 of the metallic mold F, a melted resin is injected into the resin formation space formed by the concave portion E201 and the flat surface F201 of the metallic molds E and F. As a result of this melted resin, the resin mold portion, which embeds the magnetic sensor chips 203 and 205 in the interior of the resin, is formed. When the resin solidifies, as shown in FIG. 45 to FIG. 47, the magnetic sensor chips 203 and 205 are fixed in the interior of the resin mold portion (package) 229 in a state where they are mutually inclined. It is preferable for the resin used here to be a material with a high liquidity, such that the inclination angle of the magnetic sensor chips 203 and 205 and the semiconductor chip 227 does not change due to flowing of the resin.

Lastly, the leads 215 and 216 and the connecting leads 217 are individually divided and electrically separated by clipping off the rectangular frame portion 213, and the production of the magnetic sensor 230 is completed.

The resin mold portion 229 of the magnetic sensor 230 which has been produced in the above manner, is formed in the same plan view approximate rectangular shape as the aforementioned rectangular frame portion 213. The leads 215 and 216 extend from the sides 229d to 229g of the inner area S201, which is partitioned by the resin mold portion, towards the inner side of the resin mold portion. These leads 215 and 216 are not provided in the non-installation areas S202 to S205, which are located on the corners of the inner area S201.

The back faces 216a of the leads 216 are exposed on the bottom surface 229a side of the resin mold portion 229. The one end portions of these leads 216 are electrically connected to the magnetic sensor chips 203 and 205 and the semiconductor chip 227 by metallic wires (not shown in the drawings), and these connection sections and the wires are embedded in the interior of the resin mold portion 229.

Referring to FIG. 46, the magnetic sensor chips 203 and 205 and the semiconductor chip 227 are inclined with respect to the bottom surface 229a of the resin mold portion 229. The other end portions 203b and 205b of the mutually facing magnetic sensor chips 203 and 205 face the upper face 229c side of the resin mold portion 229. The surface 203a of the magnetic sensor chip 203 is inclined at an acute angle with respect to the surface 205a of the magnetic sensor chip 205. That is to say, the angle θ of the stage portion 207, with respect to the stage portion 209, is an acute angle.

Accordingly, the sensitive directions of the magnetic sensor chips 203 and 205 are the same as the first example of the present invention explained using FIG. 7. Furthermore, it is also the same as the first example that theoretically, as long as the angle θ constituted by the A-B plane with respect to the C-D plane is larger than 0° and 90° or less, the azimuth of the three-dimensional terrestrial magnetism can be measured, although practically, 20° or more is preferable, and 30° or more is still more preferable.

This magnetic sensor 330, in the same manner as the magnetic sensor 30 of the first example, for example, is installed on the substrate within a portable terminal device, and can detect the azimuth of terrestrial magnetism.

According to the above-mentioned lead frame 201 and magnetic sensor 230, since a part of the magnetic sensor chips 203 and 205 are positioned overlapping the leads 215, miniaturization of the magnetic sensor 230 can be achieved.

Furthermore, the magnetic sensor chips 203 and 205 are positioned at one corner of the respective inner areas, or in other words, near the non-installation areas S202 and S205, overlapping only the leads 215 which protrude from one side 213a and 213c of the inner area S201. Accordingly, compared to the case where the stage portions 207 and 209 and the magnetic sensor chips 203 and 205 are disposed at a central portion of one side 213a and 213c of the inner area S201, the number of leads overlapping the magnetic sensor chips 203 and 205 decreases. Accordingly, a sufficient number of leads 216 which can be electrically connected to the magnetic sensor chips 203 and 205 can be secured without changing the position of the leads 215 and 216 with respect to the rectangular frame portion 213. As a result, it becomes possible to perform more signal input and output with respect to the magnetic sensor chips 203 and 205, and provision of a high-functionality magnetic sensor 230 becomes possible.

Furthermore, since the need to change the position of the leads 215 and 216 with respect to the rectangular frame portion 213 is eliminated, a high-functionality magnetic sensor 230 can be easily and inexpensively produced.

Moreover, by positioning the two stage portions 207 and 209 and the magnetic sensor chips 203 and 205 near the same one side 213*d* and 229*g* of the inner area S201, a separate auxiliary stage portion 223 and semiconductor chip 227 can be newly positioned in the surplus area of the inner area S201 of the rectangular frame portion 213. Therefore it becomes possible to provide an even higher functionality magnetic sensor 230 without changing the size of the rectangular frame portion 213 and the resin mold portion 229.

Furthermore, since the inclined magnetic sensor chip 203 and 205 can be made to enter the concave portion 220 formed on the surfaces 215*b* of the leads 215, contact between the magnetic sensor chip 203 and 205 and the leads 215 is prevented, and the magnetic sensor chips 203 and 205 can be greatly inclined with respect to the frame portion 211, without lengthening the length of displacement of the stage portions 207 and 209 with respect to the leads 215 in the direction of thickness of the metallic thin plate. Accordingly, miniaturization of the magnetic sensor 230 can also be achieved.

In the above-mentioned example, although the protrusions 225 were made to be provided on the auxiliary stage portion 223, it is in no way restricted to this. It is acceptable, if at the very least, the auxiliary stage portion 223 is inclined with respect to the frame portion 11 before the resin mold portion 29 is formed.

Furthermore, in a case where the mounted semiconductor chip 227 is a temperature sensor chip or a signal processing LSI, there is no need to incline the auxiliary stage portion 223. In this case, the protrusions 225 and the twisting portion of the connecting leads 217 are unnecessary.

Figure 48:
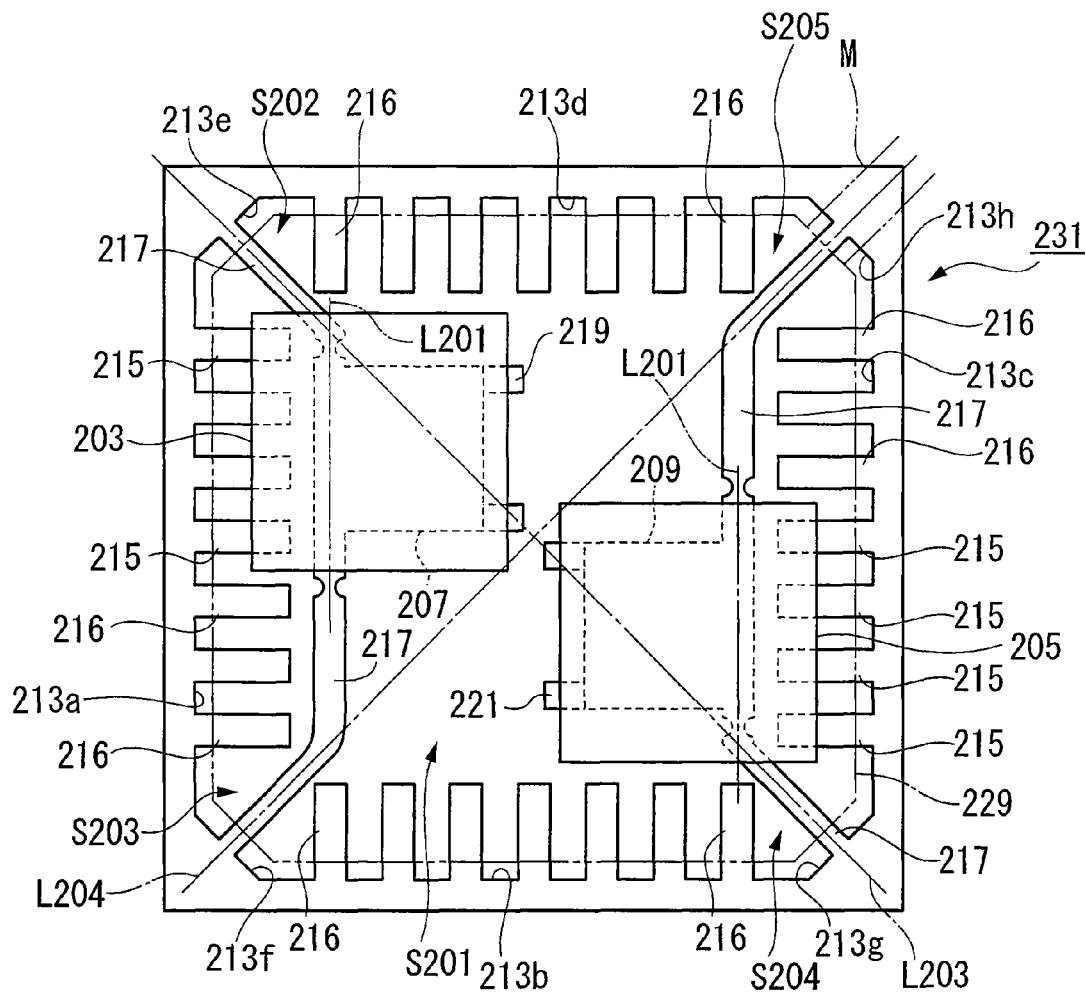
FIG. 48 is a plan view showing the lead frame and the magnetic sensor according to a fifth example of the present invention.

Next, a fifth example according to the present invention is explained with reference to FIG. 48. The lead frame and the magnetic sensor according to this fifth example differ to the fourth example in the location of the stage portion and the magnetic sensor chip with respect to the frame portion. Here, only the position of the stage portion and the magnetic sensor chip is explained, and the same reference symbols refer to parts the same as the constituent elements of the lead frame 201 and the magnetic sensor 230, and explanation thereof is omitted.

In the lead frame 231 and the magnetic sensor according to this example, the two stage portions 207 and 209 and the magnetic sensor chips 203 and 205 are positioned aligned on the diagonal line L203 of the inner area S201. The stage portions 207 and 209 are positioned, on tie corner located on the diagonal line L203, or in other words, near the non-installation areas S202 and S204.

When the magnetic sensor is produced using this lead frame 231, in a state where the rectangular frame portion 213 is sandwiched by the same molds as in the fourth example, the melted resin is injected into the resin formation space demarcated by the concave portion E201 and the flat surface portion F201 of the molds E and F, and the resin mold portion 229 which embeds the magnetic sensor chips 203 and 205 in its interior is formed. This melted resin is injected from a gate M provided on a first corner 213*h* side of the rectangular frame portion 213, which is located on a second diagonal line L204, which intersects a first diagonal line L203 in the rectangular shaped inner area S201, and flows towards a second corner 213*f* side located on the diagonal of this first corner 213*h*.

The above-mentioned resin formation space corresponds to the inner area S201 demarcated by the resin mold portion 229.

According to the above-mentioned lead frame 231 and magnetic sensor, in the same manner to the fourth example, together with being able to achieve miniaturization of the magnetic sensor, a high-functionality magnetic sensor can be easily and inexpensively produced.

Furthermore, since the stage portions 207 and 209 and the physical quantity sensor chips 203 and 205 are not located between the first corner 213*h* and the second corner 213*f*, when the resin mold portion 229 is formed, obstruction of the flow of the melted resin by the stage portions 207 and 209 and the physical quantity sensor chips 203 and 205 can be prevented. Accordingly, it is unlikely to form sections within the resin formation space which cannot be reached by the resin. In particular, the resin injected into the resin formation space from the gate M can be easily made to reach the other corner S203 which is located farthest from the gate M.

Moreover, unexpected changes in the inclination angle of the stage portions 207 and 209 and the physical quantity sensor chips 203 and 205 from pushing, as a result of the flow of the resin injected into the resin formation space, can also be prevented. Accordingly, it becomes possible to set the inclination angle of the physical quantity sensor chip 203 and 205 with good accuracy.

In the above-mentioned fourth and fifth examples, although the twisting portion of the connecting leads 217 were connected to one end portion 207*a* and 209*a* of the stage portions 207 and 209, it is in no way restricted to this. The twisting portion may be positioned in a location displaced more on the protrusion 219 and 221 side than the one end portion 207*a*, 209*a*. That is to say, the axis line L201 about which the stage portions 207 and 209 rotate may be displaced from the one end portion 207*a* and 209*a* side of the stage portions 207 and 209 to the protrusion 219 and 221 side.

Furthermore, although an example where a pair of protrusions 219 and 221 were formed on the stage portions 207 and 209 was shown, it is in no way restricted to this. That is to say, it is acceptable to form only one protrusion on the stage portions 207 and 209, and for this protrusion to be formed with a wide width from half the width of the stage portions 207 and 209 to an approximately equivalent width. Even in this configuration, since the area of the end portions of the protrusions which receive a pressing force when the stage portions 207 and 209 are inclined becomes larger, deformation of the protrusions resulting from stress relaxation is prevented. Accordingly, the inclination angle of the stage portions 207 and 209 can be stabilized.

Furthermore, in the same manner as explained in the first and the second examples, it is acceptable, if at the very least, the protrusions 219 and 221 protrude on the back face 207*d* and 209*d* side of the stage portions 207 and 209.

Moreover, it is acceptable, if at the very least, the stage portions 207 and 209 are mutually inclined before the resin mold portion 229 is formed.

Furthermore, the stage portions 207 and 209 may, for example, be formed in a plan view circular shape or oval shape, and may be made ones in which holes penetrate in the direction of thickness, or ones which are formed in a mesh form.

Moreover, in the magnetic sensor, the magnetic sensor chips 203 and 205, the stage portions 207 and 209, and the leads 215 and 216 may be stored in the interior of the box body which serves as a package, and these may be integrally fixed.

Furthermore, the two magnetic sensor chips 203 and 205 may be inclined about an axis line mutually perpendicular along the bottom surface 229*a* of the resin mold portion 229.

Moreover, although in the first to the fifth examples mentioned above, a magnetic sensor which detects the direction of magnetism in three dimensions was explained as a physical quantity sensor, it is in no way restricted to this. It is acceptable, if at the very least, the physical quantity sensor is a sensor which measures the azimuth and the orientation in three dimensions. That is to say, the physical quantity sensor may be, for example, an acceleration sensor loaded with an acceleration sensor chip which detects the magnitude and azimuth of the acceleration.

Above, the examples of the present invention were described in detail with reference to the drawings, although the specific configuration is in no way limited by these examples, and design changes are possible within a range that does not depart from the scope of the present invention.

INDUSTRIAL APPLICABILITY

The present invention can be applied to physical quantity sensors which measure the azimuth and the orientation of a physical quantity, such as magnetism and gravity, and these physical quantity sensors can be made smaller and thinner.

The invention claimed is:

1. A lead frame made from a metallic thin plate, comprising:
   at least two stage portions on which physical quantity sensor chips are to be mounted each of said stage portions having an area smaller than a mounting surface of a respective physical quantity sensor chip;
   a rectangular frame portion enclosing said stage portions;
   a plurality of leads including connecting leads, each of which extend from said frame portion in a direction of respective stage portions and are positioned on the periphery of said respective stage portions, and which connect said frame portion and said respective stage portions; and
   an easily deformed portion formed on said connecting leads, said easily deformed portion inclines said respective stage portions by becoming deformed,
   wherein when said physical quantity sensor chip is mounted, said mounting surface is superimposed on said respective stage portion and a portion of said plurality of leads in the direction of thickness of said frame portion, and
   wherein said connecting leads are aligned with one side of said frame portion, and said easily deformed portion for inclining said respective stage portion with respect to said frame portion about a principal axis line, is formed on a midway portion of the connecting leads thereof.

2. A lead frame according to claim 1, wherein said connecting leads have end portions positioned between from said midway portion to said stage portion, and base end portions positioned separated further from the stage portion than said midway portion, and said stage portions and said end portions are positioned in a location which is displaced with respect to said base end portion in the direction of thickness of said metallic thin plate.

3. A lead frame according to claim 1, wherein a surface of said connecting leads positioned between from said midway portion to said stage portion, is formed coplanar with the surface of said stage portion.

4. A lead frame made from a metallic thin plate, comprising:
   at least two stage portions on which physical quantity sensor chips are to be mounted, each of said stage portions having an area smaller than a mounting surface of a respective physical quantity sensor chip;
   a rectangular frame portion enclosing said stage portions;
   a plurality of leads including connecting leads, each of which extend from said frame portion in a direction of respective stage portions and are positioned on the periphery of said respective stage portions, and which connect said frame portion and said respective stage portions; and
   an easily deformed portion formed on said connecting leads, said easily deformed portion inclines said respective stage portions by becoming deformed,
   wherein when said physical quantity sensor chip is mounted, said mounting surface is superimposed on said respective stage portion and a portion of said plurality of leads in the direction of thickness of said frame portion, and
   wherein said connecting leads are connected to said frame portion by protruding pairwise from each stage portion in a location of line symmetry of a principal axis line which passes through the center of said stage portion, and have a deformable twisting portion as said easily deformed portion, and said twisting portion and said stage portion are positioned in a location which is displaced with respect to said leads in the direction of thickness of said lead frame.

5. A lead frame according to claim 4, wherein a concave portion which is recessed in the direction of thickness of said metallic thin plate, is formed in the surface of said lead which faces said physical quantity sensor chip, in a condition with said physical quantity sensor chip mounted on the surface of said stage.

6. A lead frame made from a metallic thin plate, comprising:
   at least two stage portions on which physical quantity sensor chips are to be mounted, each of said stage portions having an area smaller than a mounting surface of a respective physical quantity sensor chip;
   a rectangular frame portion enclosing said stage portions;
   a plurality of leads including connecting leads, each of which extend from said frame portion in a direction of respective stage portions and are positioned on the periphery of said respective stage portions, and which connect said frame portion and said respective stage portions;
   an easily deformed portion formed on said connecting leads, said easily deformed portion inclines said respective stage portions by becoming deformed; and
   a sheet-like insulator film made from an electrically insulating material, provided on a surface of said stage portion which mounts said physical quantity sensor chip,
   wherein when said physical quantity sensor chip is mounted, said mounting surface is superimposed on said respective stage portion and a portion of said plurality of leads in the direction of thickness of said frame portion,
   wherein said plurality of leads comprise a first lead that is connected to said stage portion through said connecting lead, and a second lead arrayed in a direction along said principal axis line together with said first lead,
   and on said second lead is formed an adjacent lead extending from a tip of said second lead to past said principal axis line,
   and said adjacent lead is positioned in line with said stage portion in a direction along said principal axis line, and is formed so as to be able to be inclined about said principal axis line with respect to said frame.

7. A lead frame made from a metallic thin plate, comprising:
   at least two stage portions on which physical quantity sensor chips are to be Mounted, each of said stage portions having an area smaller than a mounting surface of a respective physical quantity sensor chip;
   a rectangular frame portion enclosing said stage portions;

a plurality of leads including connecting leads, each of which extend from said frame portion in a direction of respective stage portions and are positioned on the periphery of said respective stage portions, and which connect said frame portion and said respective stage portions; and an easily deformed portion formed on said connecting leads, said easily deformed portion inclines said respective stage portions by becoming deformed, wherein when said physical quantity sensor chip is mounted, said mounting surface is superimposed on said respective stage portion and a portion of said plurality of leads in the direction of thickness of said frame portion, and wherein each of said stage portions are positioned in a location that is nearer to one corner of an inner area of said lead frame than the other corners, and a magnetic sensor chip is positioned such that it is only superimposed on a plurality of leads provided on one side of the lead frame.

8. A lead frame according to claim 7, wherein
said rectangular frame portion is formed in a plan view approximate square shape,
and said two stage portions are positioned along the same side of said inner area.

9. A lead frame according to claim 7, wherein said two stage portions are positioned on a diagonal line of said inner area.

10. A physical quantity sensor comprising:
a package formed in a plan view approximate rectangular shape;
a physical property sensor chip of a plan view approximate rectangular shape fixed at an incline inside said package; and
a plurality of leads which protrude to the inner side of said package from each side of an inner area of approximate rectangular shape in plan view which is partitioned by said package, and which are exposed to the outside from a lower face of said package,
a non-installation area in which said leads are not arranged being formed on the corner portions of said inner area, and
said physical quantity sensors being positioned spanning said non-installation area and overlapping in the thickness direction of said package, only said leads which are aligned along one side of said inner area, so that one side of said physical quantity sensor is along one side of said inner area.

11. A lead frame made from a metallic thin plate, comprising:
at least two stage portions on which physical quantity sensor chips are to be mounted, each of said stage portions having an area smaller than a mounting surface of a respective physical quantity sensor chip;
a rectangular frame portion enclosing said stage portions;
a plurality of leads including connecting leads, each of which extend from said frame portion in a direction of respective stage portions and are positioned on the periphery of said respective stage portions, and which connect said frame portion and said respective stage portions; and
an easily deformed portion formed on said connecting leads, said easily deformed portion inclines said respective stage portions by becoming deformed,
wherein when said physical quantity sensor chip is mounted, said mounting surface is superimposed on said respective stage portion and a portion of said plurality of leads in the direction of thickness of said frame portion, and
wherein at least one of said stage portions is formed with a protrusion which extends in a direction toward the other stage portion and bent with respect to said stage portion, an end portion of said protrusion being a shape which assumes roundness.

12. A lead frame according to claim 11, wherein bending process is applied to said end portion of said protrusion to be said shape which assumes roundness.

13. A lead frame according to claim 11, wherein the thickness of said end portion is formed thinner than the other portions.

14. A lead frame made from a metallic thin plate, comprising:
at least two stage portions on which physical quantity sensor chips are to be mounted, each of said stage portions having an area smaller than a mounting surface of a respective physical quantity sensor chip;
a rectangular frame portion enclosing said stage portions;
a plurality of leads including connecting leads, each of which extend from said frame portion in a direction of respective stage portions and are positioned on the periphery of said respective stage portions, and which connect said frame portion and said respective stage portions; and
an easily deformed portion formed on said connecting leads, said easily deformed portion inclines said respective stage portions by becoming deformed,
wherein when said physical quantity sensor chip is mounted, said mounting surface is superimposed on said respective stage portion and a portion of said plurality of leads in the direction of thickness of said frame portion, and
wherein said connecting leads are connected to said frame portion by protruding pairwise from each stage portion in a location of line symmetry of a principal axis line which passes through the center of said stage portion, and have a deformable twisting portion as said easily deformed portion, said connecting leads being connected to one end portion of said stage portion and said deformable twisting portion being formed near said stage portion so that said stage portion is inclined around a twisting axis line parallel to one side perpendicular to said principal axis line of said stage portion.

15. A lead frame made from a metallic thin plate, comprising:
at least two stage portions on which physical quantity sensor chips are to be mounted, each of said stage portions having an area smaller than a mounting surface of a respective physical quantity sensor chip;
a rectangular frame portion enclosing said stage portions;
a plurality of leads including connecting leads, each of which extend from said frame portion in a direction of respective stage portions and are positioned on the periphery of said respective stage portions, and which connect said frame portion and said respective stage portions; and
an easily deformed portion formed on said connecting leads, said easily deformed portion inclines said respective stage portions by becoming deformed,
wherein when said physical quantity sensor chip is mounted, said mounting surface is superimposed on said respective stage portion and a portion of said plurality of leads in the direction of thickness of said frame portion, and wherein said connecting leads are connected to said frame portion by protruding pairwise from each stage portion in a location of line symmetry of a principal axis line which passes through the center of said stage portion, and have a deformable twisting portion as said easily deformed portion, said connecting leads being connected to respective side of said stage portion to form a twisting axis line perpendicular to said principal axis line so that said stage portion is inclined around said twisting axis line with one side parallel to said twisting axis line located higher than said twisting axis line and with the other side parallel to said twisting axis line located lower than said twisting axis line.

* * * * *